(12) United States Patent
Sugimoto

(10) Patent No.: US 11,609,468 B2
(45) Date of Patent: Mar. 21, 2023

(54) ELECTRO-OPTICAL DEVICE AND ELECTRONIC APPARATUS

(71) Applicant: SEIKO EPSON CORPORATION, Tokyo (JP)

(72) Inventor: Yohei Sugimoto, Nagano-Ken (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/676,774

(22) Filed: Feb. 21, 2022

(65) Prior Publication Data
US 2022/0269119 A1 Aug. 25, 2022

(30) Foreign Application Priority Data
Feb. 22, 2021 (JP) .............................. JP2021-025981

(51) Int. Cl.
*G02F 1/1368* (2006.01)
*G02F 1/1362* (2006.01)

(52) U.S. Cl.
CPC ...... *G02F 1/1368* (2013.01); *G02F 1/136209* (2013.01); *G02F 1/136286* (2013.01)

(58) Field of Classification Search
CPC .................................................. G02F 1/1368
See application file for complete search history.

(56) References Cited

U.S. PATENT DOCUMENTS

| 5,835,171 A | 11/1998 | Hanazawa et al. |
| 6,493,046 B1 * | 12/2002 | Ueda ................. G02F 1/136213 349/38 |
| 2016/0291434 A1 * | 10/2016 | Sugimoto ............. H01L 29/786 |
| 2019/0196281 A1 * | 6/2019 | Oikawa ................. H01L 27/124 |
| 2021/0116766 A1 * | 4/2021 | Sugimoto ........... H01L 27/1218 |

FOREIGN PATENT DOCUMENTS

| JP | H0954343 | 2/1997 |
| JP | 2001066633 | 3/2001 |
| JP | 2004158518 | 6/2004 |

* cited by examiner

*Primary Examiner* — Sang V Nguyen
(74) *Attorney, Agent, or Firm* — JCIPRNET

(57) ABSTRACT

A TFT is provided that has a semiconductor layer in which one source drain region, one LDD region, a channel region, another LDD region, and a first portion of another source drain region extend along a first direction at a position overlapping a scanning line, and a second portion of the other source drain region extends along a second direction at a position overlapping a data line, a light shielding wall is disposed along the one LDD region or the other LDD region extending along the first direction, a substrate has a recessed portion in a region overlapping the light shielding wall, and a part of the light shielding wall is disposed along a side surface and a bottom surface of the recessed portion.

7 Claims, 40 Drawing Sheets

ELECTRO-OPTICAL DEVICE AND ELECTRONIC APPARATUS

The present application is based on, and claims priority from JP Application Serial Number 2021-025981, filed Feb. 22, 2021, the disclosure of which is hereby incorporated by reference herein in its entirety.

BACKGROUND

1. Technical Field

The present disclosure relates to an electro-optical device and an electronic apparatus.

2. Related Art

JP 2001-66633 A discloses a liquid crystal device as an electro-optical device including a transistor for supplying image signals to a pixel electrode, and a retention capacitor for retaining an image signal for a fixed period of time. For example, the transistor and the retention capacitor are configured by a part of the same semiconductor layer. In addition, the transistor is disposed along a scanning line in order to ensure a retention capacitor and improve an opening ratio.

However, there is a problem that, in the transistor disposed along the scanning line, light passing through a pixel is easily incident on the transistor, which may affect display quality. In other words, it is required to increase an opening ratio, ensure a light shielding property, and ensure a retention capacitor.

SUMMARY

An electro-optical device includes a substrate having a recessed portion, a scanning line extending along a first direction, a data line extending along a second direction intersecting the first direction, a transistor having a semiconductor layer in which one source drain region, one LDD region, a channel region, another LDD region, and a first portion of another source drain region extend along the first direction, at a position overlapping the scanning line, and a second portion of the other source drain region extends along the second direction, at a position overlapping the data line, and a light shielding wall that is disposed along the one LDD region or the other LDD region and has a part disposed in the recessed portion of the substrate.

An electronic apparatus includes the electro-optical device described above.

DESCRIPTION OF EXEMPLARY EMBODIMENTS

In each of the drawings below, as necessary, XYZ axes are assigned as coordinate axes orthogonal to each other, a direction indicated by each arrow is referred to as a + direction, and a direction opposite the + direction is referred to as a − direction. Note that, a +Z direction may be referred to as an upside and a −Z direction as a downside, and viewing from the +Z direction is referred to as in plan view, or planarly. Furthermore, in the following description, for example, for a substrate, a description of "at the substrate" refers to any of a case of being disposed at and in contact with the substrate, a case of being disposed at the substrate via another structure, or a case where a part is disposed at and in contact with the substrate, and a part is disposed via another structure.

In the present exemplary embodiment, an active drive type liquid crystal device including a thin film transistor as a transistor for each pixel will be exemplified as an electro-optical device. Note that, hereinafter, thin film transistor is abbreviated as TFT. The liquid crystal device can be used favorably as a light modulation device in a projection-type display device as an electronic apparatus described below, for example.

First, a configuration of a liquid crystal device 100 will be described below with reference to FIG. 1 to FIG. 3.

Figure 1:
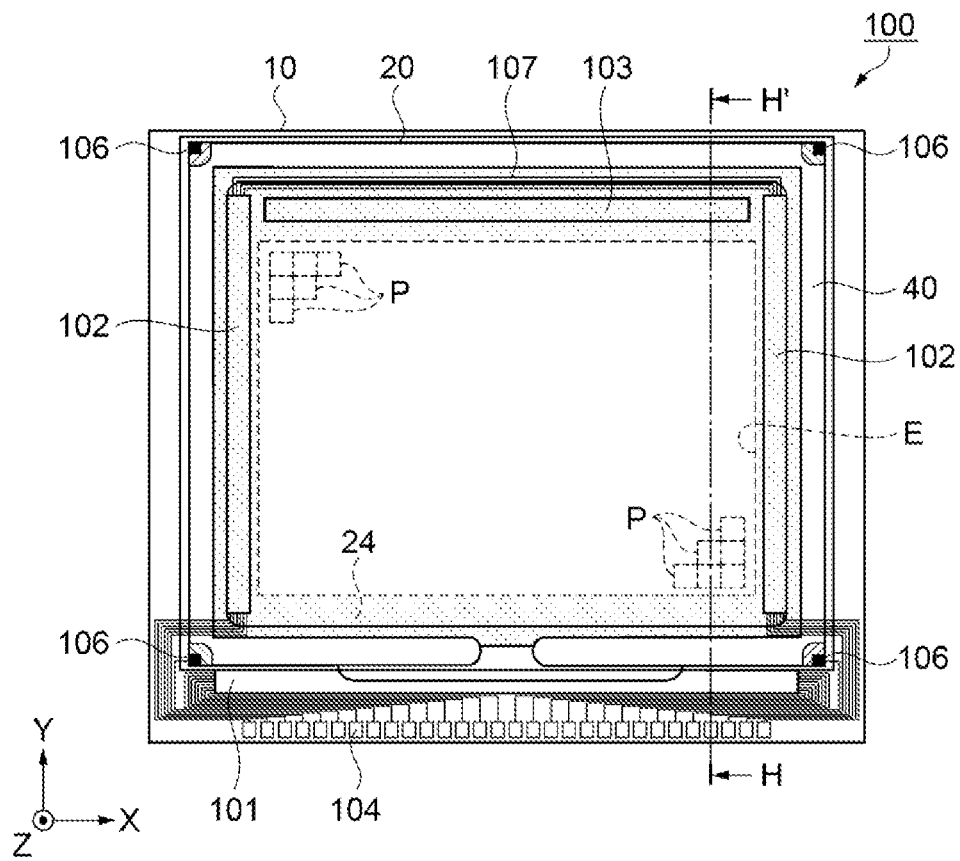
FIG. 1 is a schematic plan view illustrating a configuration of a liquid crystal device as an electro-optical device.
Figure 2:
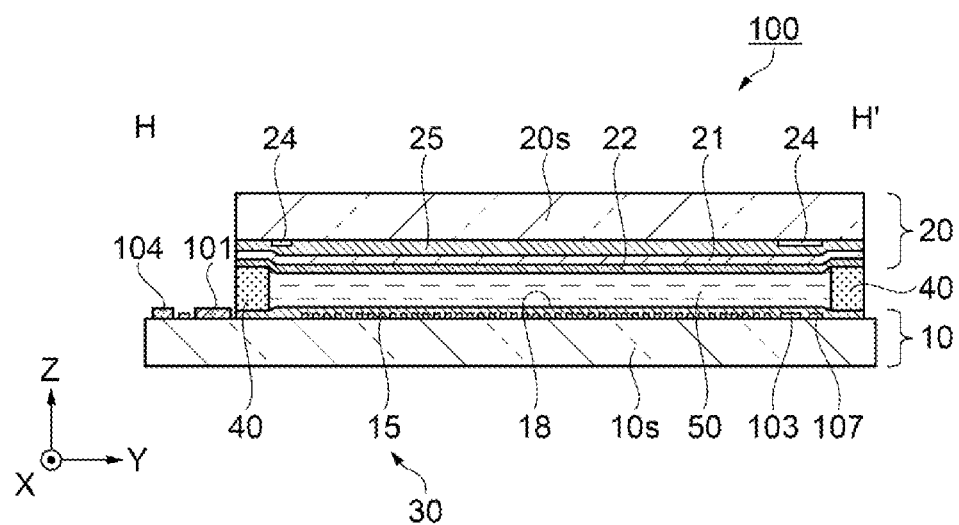
FIG. 2 is a cross-sectional view along an H-H' line of the liquid crystal device illustrated in FIG. 1.

As illustrated in FIG. 1 and FIG. 2, the liquid crystal device 100 of the present exemplary embodiment includes an element substrate 10, a counter substrate 20 disposed facing the element substrate 10, and a liquid crystal layer 50 including liquid crystal sandwiched between the element substrate 10 and the counter substrate 20.

A substrate such as a glass substrate or a quartz substrate is used for a substrate 10s of the element substrate 10. A transparent substrate such as a glass substrate or a quartz substrate is used for a substrate 20s of the counter substrate 20.

A shape in plan view of the element substrate 10 is larger than the counter substrate 20. The element substrate 10 and the counter substrate 20 are bonded to each other via a seal material 40 disposed along an outer edge of the counter substrate 20. Liquid crystal having positive or negative dielectric anisotropy is encapsulated in a gap between the element substrate 10 and the counter substrate 20 to provide the liquid crystal layer 50.

A display region E including a plurality of pixels P arrayed in a matrix is provided inside the seal material 40. A partition portion 24 is provided surrounding the display region E, between the seal material 40 and the display region E. A dummy pixel area (not illustrated) that does not contribute to display is provided around the display region E.

The element substrate 10 is provided with a terminal portion in which a plurality of external coupling terminals 104 are arrayed. A data-line drive circuit 101 is provided between a first side portion along the terminal portion and the seal material 40. In addition, an inspection circuit 103 is provided between the seal material 40 along a second side portion facing the first side portion and the display region E.

A scanning line drive circuit 102 is provided between the seal material 40 along each of a third side portion and a fourth side portion orthogonal to the first side portion and facing each other, and the display region E. Further, between the seal material 40 of the second side portion and the inspection circuit 103, a plurality of lines of wiring 107 coupling the two scanning line drive circuits 102 are provided.

A wiring line linked to the data-line drive circuit 101 and the scanning line drive circuit 102 is coupled to the plurality of external coupling terminals 104 arrayed along the first side portion. Note that, the disposition of the inspection circuit 103 is not limited to the above.

Here, directions along the first side portion are ±X directions as first directions. Further, second directions that intersect the first directions are ±Y directions, which are directions orthogonal to the first side portion and along the third side portion and the fourth side portion that face each other. In addition, normal directions of the element substrate 10 and the counter substrate 20 orthogonal to the ±X directions and the ±Y directions are ±Z directions.

As illustrated in FIG. 2, at a surface of the substrate 10s on the liquid crystal layer 50 side, a transmissive pixel electrode 15 and a TFT 30 as a transistor being a switching element, which are provided for each of the pixels P, and signal wirings, and an alignment film 18 covering these components are provided. The TFT 30 and the pixel electrode 15 are constituent elements of each pixel P. The element substrate 10 includes the substrate 10s, the pixel electrode 15, the TFT 30, the signal wirings, and the alignment film 18 that are provided at the substrate 10s. The pixel electrode 15 is provided corresponding to the TFT 30.

The partition portion 24, an insulating layer 25 formed so as to cover the partition portion 24, a counter electrode 21 as a common electrode provided covering the insulating layer 25, and an alignment film 22 covering the counter electrode 21 are provided at a surface of the substrate 20s on the liquid crystal layer 50 side. The counter substrate 20 in the present exemplary embodiment includes at least the partition portion 24, the counter electrode 21, and the alignment film 22. Note that, in the present exemplary embodiment, the example in which the common electrode is disposed on the counter substrate 20 side as the counter electrode 21 is illustrated, but the present disclosure is not limited thereto.

As illustrated in FIG. 1, the partition portion 24 surrounds the display region E and is provided at a position where the partition portion 24 planarly overlaps the scanning line drive circuit 102 and the inspection circuit 103. As a result, light incident on these circuits from the counter substrate 20 side is shielded, and erroneous operation of the circuit due to the incident light is prevented. Further, unnecessary stray light is shielded so as not to be incident on the display region E, ensuring high contrast in display in the display region E.

The insulating layer 25 is formed of an inorganic material such as, for example, silicon oxide having optical transparency. The insulating layer 25 covers the partition portion 24 and is provided so that the surface on the liquid crystal layer 50 side is flat.

The counter electrode 21 includes a transparent conductive film such as Indium Tin Oxide (ITO) or Indium Zinc Oxide (IZO), covers the insulating layer 25, and is also electrically coupled to vertical conducting portions 106 provided at four corners of the counter substrate 20, respectively. The vertical conducting portion 106 is electrically coupled to wirings on the element substrate 10 side.

The alignment film 18 covering the pixel electrode 15 and the alignment film 22 covering the counter electrode 21 are selected based on an optical design of the liquid crystal device 100. Examples of a forming material of the alignment films 18 and 22 include an inorganic alignment film such as silicon oxide, and an organic alignment film such as polyimide.

The liquid crystal device 100 thus configured is of a transmissive-type, for example, and an optical design of a normally white mode in which transmittance of the pixel P when no voltage is applied is greater than transmittance when voltage is applied, and a normally black mode in which the transmittance of the pixel P when no voltage is applied is less than transmittance when voltage is applied. A polarizing element is disposed, on each of a light incidence side and a light emitting side of a liquid crystal panel including the element substrate 10 and the counter substrate 20, in accordance with the optical design.

In the present exemplary embodiment, an example is described, in which the optical design of the normally black mode is applied, using the inorganic alignment films described as the alignment films 18 and 22, and liquid crystal having negative dielectric anisotropy.

Next, an electrical configuration of the liquid crystal device 100 will be described below with reference to FIG. 3.

Figure 3:
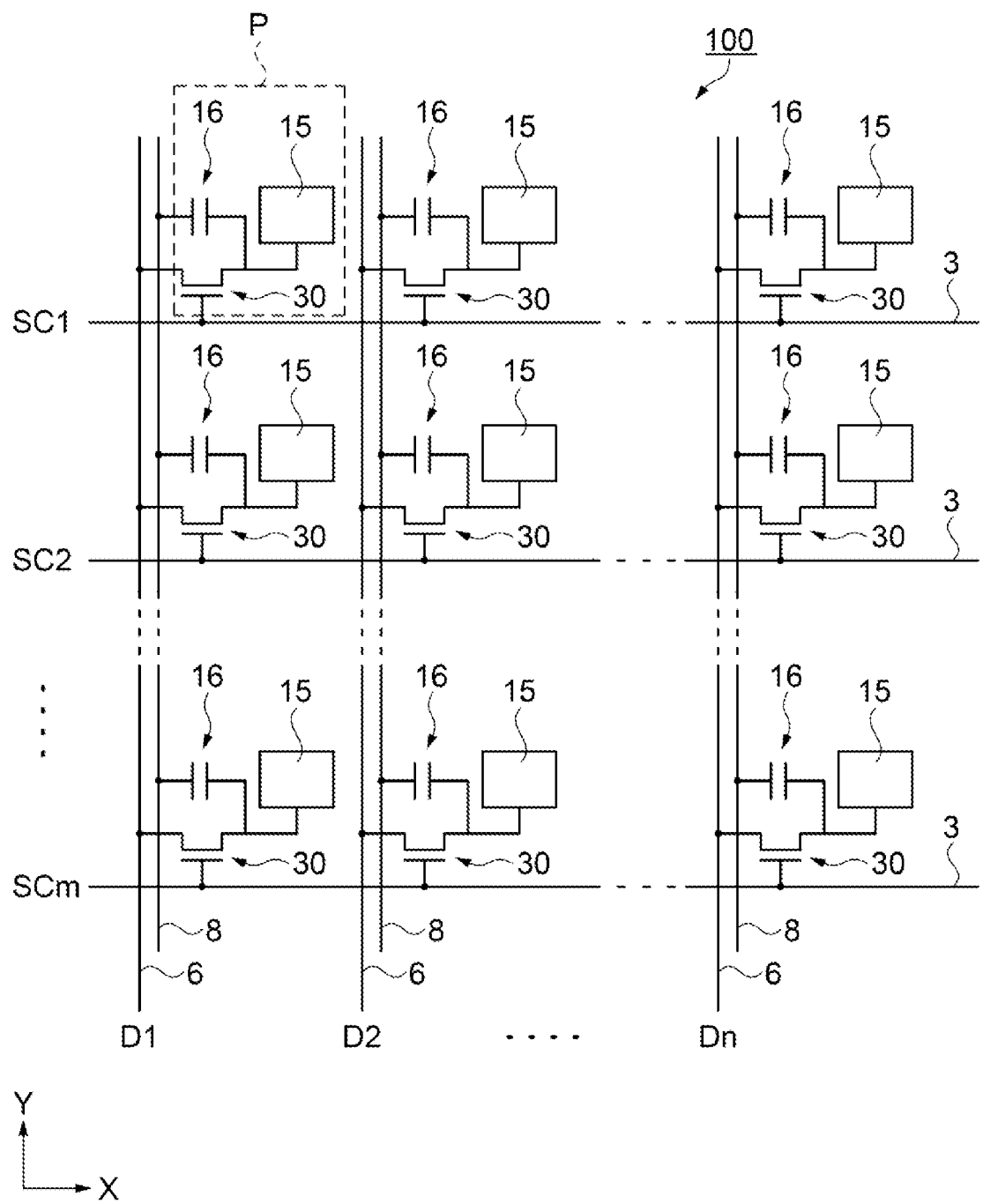
FIG. 3 is an equivalent circuit diagram illustrating the electrical configuration of a liquid crystal device.

As illustrated in FIG. 3, the liquid crystal device 100 includes a plurality of scanning lines 3, a plurality of data lines 6, and a plurality of capacitance lines 8 disposed in parallel with the data line 6, as signal wirings insulated from each other and orthogonal to each other at least in the display region E. The scanning line 3 extends in the ±X directions as the first directions. The data line 6 extends in the ±Y directions as the second directions intersecting the first directions. Note that in FIG. 3, directions in which the capacitance line 8 extends are the ±Y directions, but the present disclosure is not limited thereto.

The scanning line 3, the data line 6, and the capacitance line 8 are provided, and the pixel electrode 15, the TFT 30, and a capacitance element 16 are provided in a region partitioned by these signal wirings and the like, and these constitute a pixel circuit of the pixel P. The pixel electrode 15, the TFT 30, and capacitance element 16 are disposed for each pixel P.

The scanning line 3 is electrically coupled to a gate of the TFT 30. Specifically, the data line 6 is electrically coupled to a data line side source drain region, which is one source drain region in the TFT 30. The scanning line 3 has a function to simultaneously control on and off of the TFTs 30 provided in the same row. The pixel electrode 15 is electrically coupled to a pixel electrode side source drain region, which is another source drain region in the TFT 30. A semiconductor layer including the source drain region of the TFT 30 will be described later.

The data lines 6 are electrically coupled to the data-line drive circuit 101 described above, and supply image signals D1, D2, . . . , and Dn supplied from the data-line drive circuit 101 to the pixels P. The scanning lines 3 are electrically coupled to the scanning line drive circuit 102 described above, and supply scanning signals SC1, SC2, . . . , and SCm supplied from the scanning line drive circuit 102, to the pixels P.

The image signal D1 to the image signal Dn supplied from the data-line drive circuit 101 to the data lines 6 may be line-sequentially supplied in this order, or may be supplied to the plurality of respective data lines 6 adjacent to each other in groups. The scanning line drive circuit 102 line-sequentially supplies the scanning signal SC1 to the scanning signal SCm to the scanning lines 3 in a pulsed manner at predetermined timings.

In the liquid crystal device 100, the TFTs 30 each being the switching element are brought into an on state for a fixed period of time by input of the scanning signal SC1 to the scanning signal SCm. As a result, the image signal D1 to the image signal Dn supplied from the data lines 6 are written to the pixel electrodes 15 at predetermined timing. Drain potential corresponding to the image signal Dn is supplied to the pixel electrode 15. The image signal D1 to the image Dn of a predetermined level written into the liquid crystal layer 50 via pixel electrodes 15 are held for a certain period between the pixel electrodes 15 and the counter electrode 21, which are disposed facing the pixel electrodes 15 being intervened by the liquid crystal layer 50.

To prevent the image signal D1 to the image signal Dn held from leaking, the capacitance element 16 is coupled in parallel with a liquid crystal capacitor provided between the pixel electrode 15 and the counter electrode 21. Details of the semiconductor layer and the capacitance element 16 will be described later.

Here, although not illustrated in FIG. 3, the inspection circuit 103 described above is coupled to the data line 6. Therefore, in a manufacturing process of the liquid crystal device 100, the above image signal can be detected via the inspection circuit 103, to check operational malfunction and the like of the liquid crystal device 100.

Next, a configuration of the pixel P in the liquid crystal device 100 will be described with reference to FIG. 4.

Figure 4:
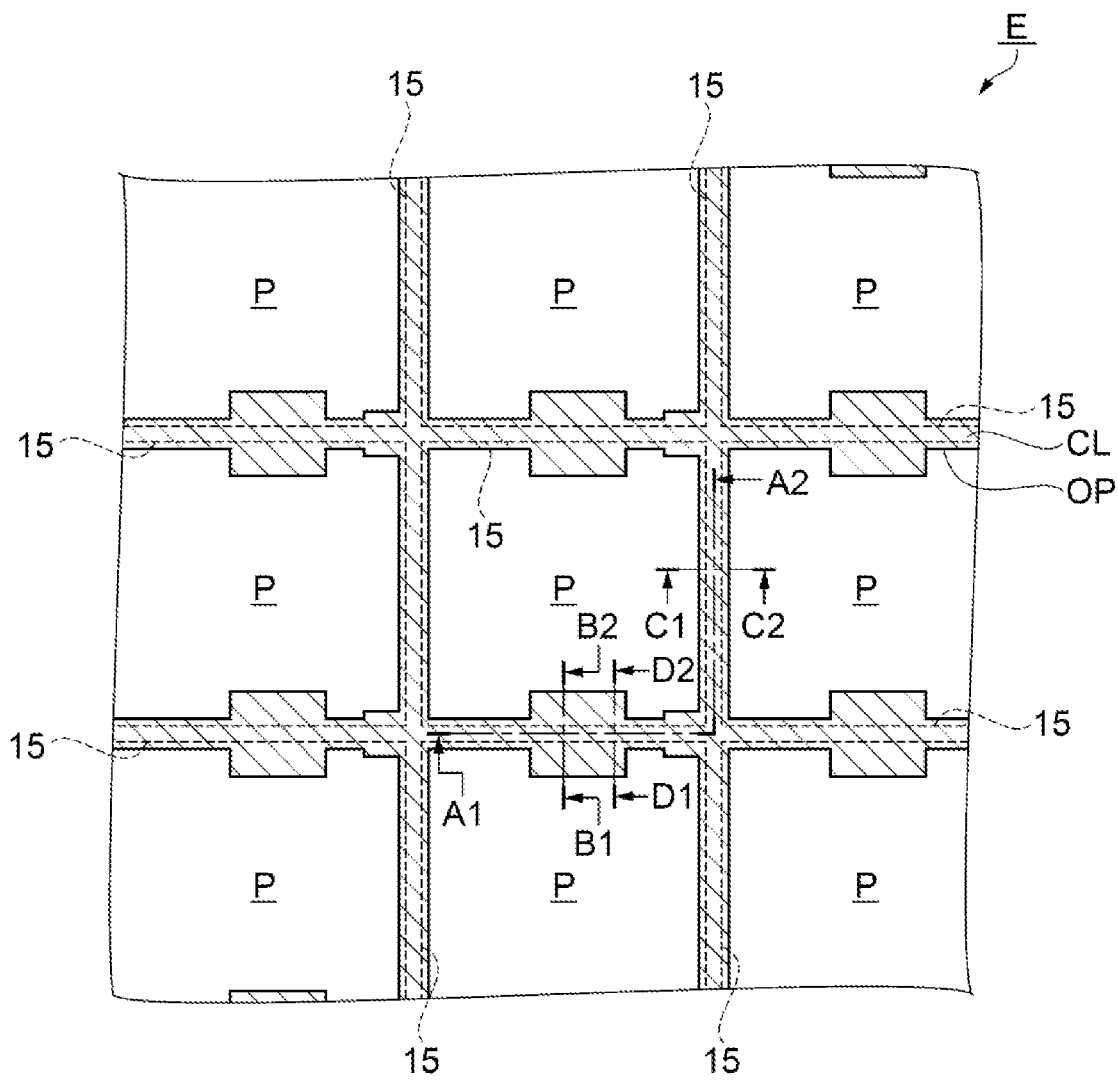
FIG. 4 is a schematic plan view illustrating arrangement of a pixel.

As illustrated in FIG. 4, the pixels P in the liquid crystal device 100 are disposed in a matrix in the ±X directions and the ±Y directions in the display region E. The pixel P has, for example, an opening region OP that is substantially square in plan view. The opening region OP is surrounded by closed regions CL having a light shielding property, extending in the ±X directions and in the ±Y directions, and provided in a lattice pattern.

In the closed region CL extending in the ±X directions, the scanning line 3 described above is provided. A conductive member having a light shielding property is used for each scanning line 3, and the closed region CL partially includes the scanning line 3.

In the closed region CL extending in the ±Y directions, the data line 6 described above is provided. A conductive member having a light shielding property is also used for the data line 6, and the closed region CL partially includes the data line 6.

The closed regions CL are constituted by the scanning line 3, the data line 6, the TFT 30, the capacitance line 8, and the like provided at the element substrate 10. Furthermore, the closed region CL may include a light shielding portion provided in the same layer as the partition portion 24 illustrated in FIG. 2 and being a black matrix patterned in a lattice shape, in the counter substrate 20.

In the closed region CL extending in the ±X directions, in a middle of the ±X directions corresponding to each pixel P, the TFT 30 described above is provided. In addition, in the closed region CL extending in the ±Y directions, the capacitance element 16 is provided between the pixels P adjacent to each other. Detailed structure of the pixel P including a contact hole and the capacitance element 16 will be described later.

The pixel electrode 15, which has a substantially square shape in plan view, is provided for each of the pixels P. The pixel electrode 15 is provided in the opening region OP such that an outer edge overlaps the closed region CL. A plurality of the pixel electrodes 15 are disposed in a matrix corresponding to the pixels P.

The liquid crystal device 100 of the present exemplary embodiment is of the transmissive-type as described above, and is configured assuming that light is incident from the counter substrate 20 side. As such, the element substrate 10 is provided with structure that reduces not only light directly incident on the TFT 30, but also diffraction light, reflected light, and the like originating from incident light. Further, the liquid crystal device 100 includes the capacitance element 16 having an increased retention capacitor.

Note that, an incident direction of light on the liquid crystal device 100 is not limited to from the counter substrate 20 side, but may be from the element substrate 10 side. In addition, the liquid crystal device 100 may have a configuration in which a focusing means such as a microlens that focuses incident light on each pixel P is provided at a substrate on a side on which light is incident.

Next, a configuration in which the element substrate 10 of the liquid crystal device 100 is viewed in cross-sectional view will be described with reference to FIG. 5. Note that, in FIG. 5, four cross-sections are illustrated side by side, which include an A1-A2 line, a C1-C2 line, a B1-B2 line, and a D1-D2 line in FIG. 4, respectively, and are along the ±Z directions. Further, FIG. 5 does not illustrate the alignment film 18.

Figure 5:
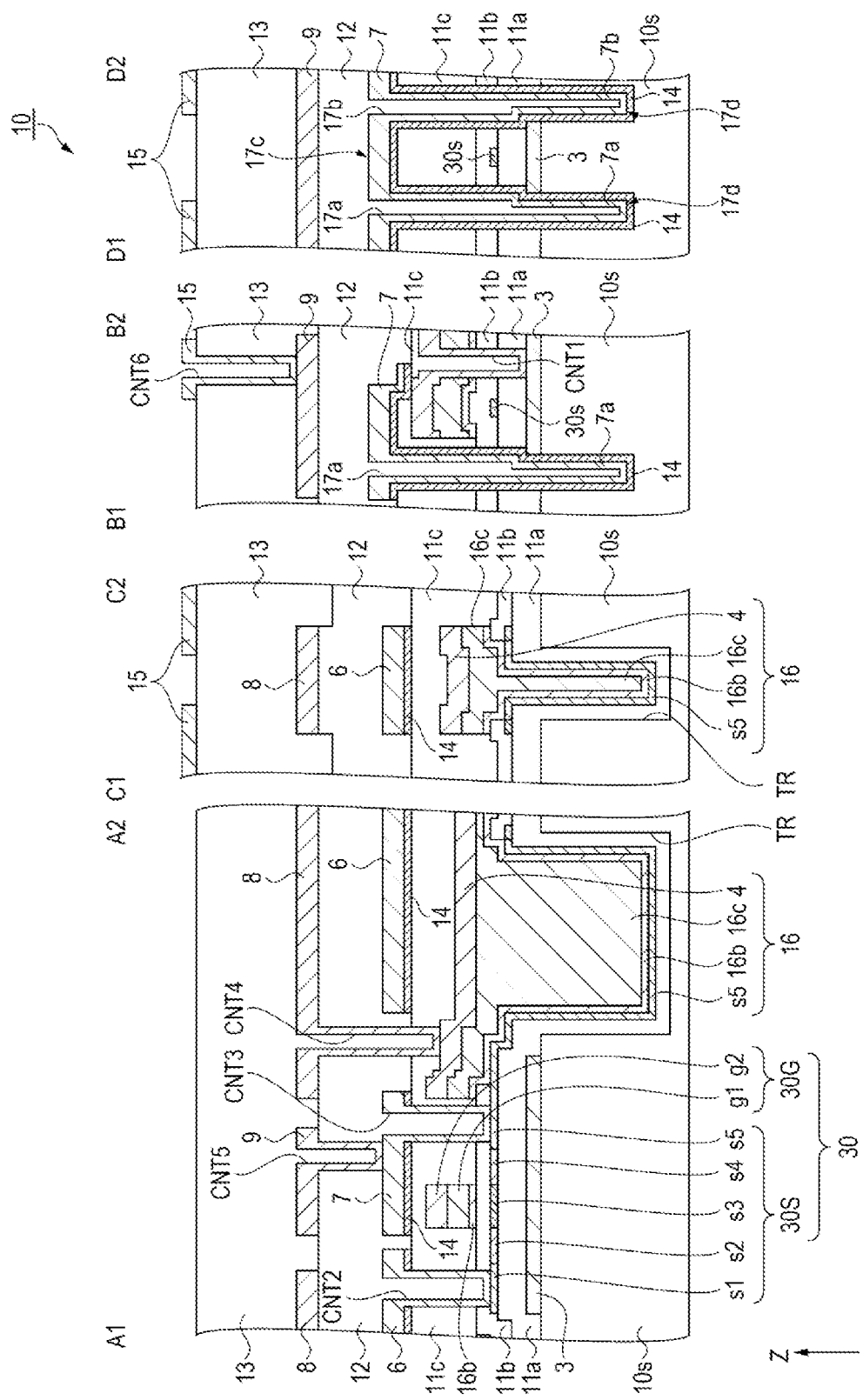
FIG. 5 is a schematic cross-sectional view illustrating structure of an element substrate.

As illustrated in FIG. 5, the element substrate 10 of the liquid crystal device 100 includes the substrate 10s, the scanning line 3, the TFT 30 including a semiconductor layer 30S and a gate electrode 30G, the capacitance element 16, the data line 6, and a plurality of interlayer insulating layers. The substrate 10s of the element substrate 10 has a trench TR. A first layer to a sixth layer are layered as a plurality of layers at the substrate 10s.

The plurality of layers in the element substrate 10 have, in order from below, the first layer including the scanning line 3, the second layer including the semiconductor layer 30S, the third layer including the gate electrode 30G, the fourth layer including the data line 6, the fifth layer including the capacitance line 8 as a capacitive wiring, and the sixth layer including the pixel electrode 15.

A first interlayer insulating layer 11a is provided between the first layer and the second layer, a gate insulating layer 11b and a capacitor insulating layer 16b are provided between the second layer and the third layer, a second interlayer insulating layer 11c is provided between the third layer and the fourth layer, and a third interlayer insulating layer 12 is provided between the fourth layer and the fifth layer, and a fourth interlayer insulating layer 13 is provided between the fifth layer and the sixth layer. This prevents occurrence of a short circuit between the layers.

The first layer on the substrate 10s is provided with the scanning line 3. The scanning line 3 is provided in the closed region CL illustrated in FIG. 4 in plan view. The scanning line 3 has a part extending in the ±X directions, and a part protruding from the above part in the ±Y directions.

A known forming material having a light shielding property and electrical conductivity can be adopted for the scanning line 3. Therefore, the scanning line 3 primarily has a function of shielding light incident on the semiconductor layer 30S from below. In the present exemplary embodiment, tungsten silicide is used as the forming material of the scanning line 3. A thickness of the scanning line 3 is, for example, approximately 150 nm. Note that, in the present specification, a thickness of each layer in the ±Z directions is also simply referred to as a "thickness".

The first interlayer insulating layer 11a is provided between the scanning line 3 and the second layer. The first interlayer insulating layer 11a insulates the scanning lines 3 from the semiconductor layer 30S. A silicon-based oxide film or the like is adopted as a forming material of the first interlayer insulating layer 11a. Examples of the forming material include, for example, silicon oxide (Non-doped Silicate Glass: NSG) and silicon nitride. In the present exemplary embodiment, silicon oxide is used as the forming material of the first interlayer insulating layer 11a. A thickness of the first interlayer insulating layer 11a is, for example, approximately 200 nm.

The second layer and the third layer above the first layer are provided with the TFT 30, and the capacitance element 16. The TFT 30 has the semiconductor layer 30S provided in the second layer, and the gate electrode 30G provided in the third layer. LDD (Lightly Doped Drain) structure is formed in the semiconductor layer 30S of the TFT 30.

The semiconductor layer 30S is provided in the closed region CL illustrated in FIG. 4 in plan view. Specifically, the semiconductor layer 30S is bent in the ±Y directions from the ±X directions in correspondence with a part in the closed region CL where the ±X directions and the ±Y directions intersect (see FIG. 12). In the semiconductor layer 30S, each of one source drain region s1, one LDD region s2, a channel region s3, another LDD region s4, and a part of another source drain region s5 extends along the ±X directions at a position overlapping the scanning line 3 in plan view.

Figure 16:
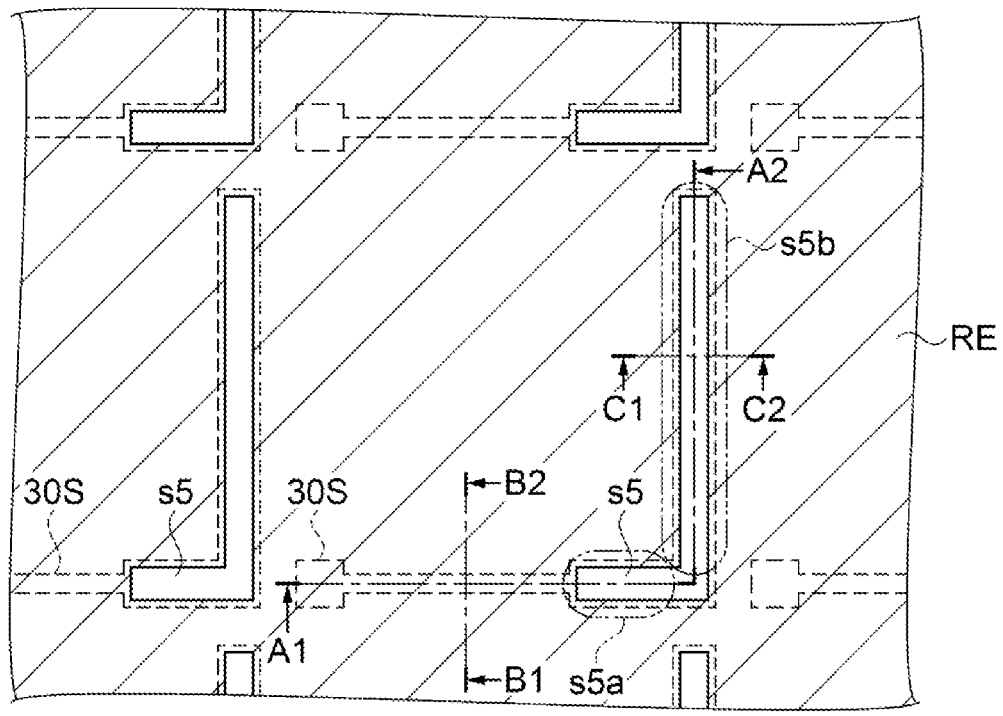
FIG. 16 is a schematic plan view illustrating the method for manufacturing the element substrate.
Figure 16:
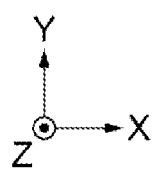

Of the semiconductor layer 30S, the other source drain region s5 is bent in the ±Y directions from the ±X directions in plan view, and extends along the ±Y directions (see FIG. 16). The other source drain region s5 includes a first portion s5a and a second portion s5b. The first portion s5a is a part of the other source drain region s5 that extends in the ±Y directions, is at a position overlapping the data line 6 in plan view, and is also provided in an inside of the trench TR, which will be described later. The second portion s5b is a part of the other source drain region s5 that extends in the ±Y directions, and also functions as a lower capacitance electrode of the capacitance element 16.

The semiconductor layer 30S has the LDD regions s2 and s4 with high electrical resistance with the channel region s3 interposed therebetween. Thus, a leakage current at an off time is suppressed. In terms of leakage current suppression at the off time, a configuration may be adopted in which the LDD region s4 is included in a junction portion between the other source drain region s5 to which the capacitance element 16 and the pixel electrode 15 are electrically coupled, and the channel region s3. The semiconductor layer 30S includes a polysilicon film obtained by applying a crystallizing process to an amorphous silicon film, for example. A thickness of the semiconductor layer 30S is approximately 50 nm, for example.

The gate insulating layer 11b is provided covering the semiconductor layer 30S. The gate insulating layer 11b is present between the semiconductor layer 30S and the gate electrode 30G, and insulates the semiconductor layer 30S from the gate electrode 30G. The gate insulating layer 11b has, for example, double structure formed of two types of silicon oxide. A thickness of the gate insulating layer 11b is approximately 75 nm, for example.

The capacitor insulating layer 16b is provided covering a part of the gate insulating layer 11b, and a part of the other source drain region s5. Of the capacitor insulating layer 16b, a part overlapping the channel region s3 in plan view insulates the semiconductor layer 30S from the gate electrode 30G, together with the gate insulating layer 11b. A part of the capacitor insulating layer 16b overlapping the other source drain region s5 functions as a dielectric layer of the capacitance element 16.

A dielectric material is used for the capacitor insulating layer 16b. Examples of the dielectric material include, for example, hafnium oxide, aluminum oxide, silicon oxide, silicon nitride, tantalum oxide, and the like, and a single layer or a combination of these films is used. In the present exemplary embodiment, silicon nitride is used as the dielectric material of the capacitor insulating layer 16b. A thickness of the capacitor insulating layer 16b may be thinner than the thickness of the gate insulating layer 11b, and is approximately 20 nm, for example.

The gate electrode 30G is provided in the third layer so as to face the channel region s3 of the semiconductor layer 30S in the ±Z directions. The gate electrode 30G includes a first gate electrode g1 and a second gate electrode g2. The first gate electrode g1 is disposed above the channel region s3 via the gate insulating layer 11b and the capacitor insulating layer 16b. The second gate electrode g2 is disposed above the first gate electrode g1.

As a forming material of the first gate electrode g1, conductive polysilicon, metal silicide, metal, a metallic compound, or the like is used. In the present exemplary embodiment, the first gate electrode g1 includes double-layer structure of a conductive polysilicon film and a tungsten silicide film. A thickness of the first gate electrode g1 is approximately 150 nm, for example.

Here, in the present exemplary embodiment, hereinafter, the conductive polysilicon film refers to a polysilicon film in which phosphorus atoms are injected and electrical conductivity is given. Note that, the atoms to be injected are not limited to the phosphorus atoms.

A metallic compound having a light shielding property such as tungsten silicide is used for a forming material of the second gate electrode g2. A thickness of the second gate electrode g2 is approximately 60 nm, for example.

The second gate electrode g2 is electrically coupled to the scanning line 3 via a contact hole CNT1. The contact hole CNT1 penetrates the first interlayer insulating layer 11a, the gate insulating layer 11b, the capacitor insulating layer 16b, and the first gate electrode g1. The contact hole CNT1 is spaced apart from the semiconductor layer 30S, and is disposed at a part protruding in the +Y direction of the scanning line 3 (see FIG. 19A and FIG. 20).

The trench TR is provided along the +X direction side of the pixel P in plan view in the closed region CL described above. The trench TR is a substantially rectangular recessed portion in plan view. The trench TR includes a bottom surface along an XY plane and a side surface along the ±Z directions, and an upside is open.

The capacitance element 16 described above is provided in the inside of the trench TR. The capacitance element 16 is constituted by the other source drain region s5, the capacitor insulating layer 16b, a first upper capacitance electrode 16c, and a second upper capacitance electrode 4. The capacitance element 16 has a function of increasing a retention capacitor and improve potential retention characteristics in the pixel electrode 15.

Each layer constituting the capacitance element 16 described above is provided covering the side surface and the bottom surface of the trench TR. Note that, the capacitance element 16 is also partially provided at an upper edge of the trench TR in addition to the inside of the trench TR.

Above the gate electrode 30G, the first upper capacitance electrode 16c, and the second upper capacitance electrode 4, the second interlayer insulating layer 11c is provided covering these electrodes. The second interlayer insulating layer 11c is also provided at a position that planarly overlaps the TFT 30. The second interlayer insulating layer 11c is provided by using more than one types of silicon-based oxide films such as an NEOS (Tetraethyl Orthosilicate) film, an NSG film, a PSG (Phospho Silicate Glass) film containing phosphorus (P), a BSG (Boro Silicate Glass) film containing boron (B), and a BPSG (Boro-Phospho Silicate Glass) film containing boron and phosphorus. In the present exemplary embodiment, silicon oxide is used as a forming material of the second interlayer insulating layer 11c. A thickness of the second interlayer insulating layer 11c is approximately 400 nm, for example.

Contact holes CNT2 and CNT3 are provided in the second interlayer insulating layer 11c. The contact holes CNT2 and CNT3 penetrate the second interlayer insulating layer 11c and the gate insulating layer 11b, and reach the semiconductor layer 30S. Specifically, the contact hole CNT2 electrically couples the one source drain region s1 of the semiconductor layer 30S and the data line 6 in an upper layer. The contact hole CNT3 electrically couples the other source drain region s5 of the semiconductor layer 30S and a second relay layer 7, which will be described later.

The data line 6 and the second relay layer 7 are provided in the fourth layer above the third layer covering the second interlayer insulating layer 11c and the like. As described above, the data line 6 extends in the ±Y directions in the closed region CL of the pixel P. The data line 6 is electrically coupled to the one source drain region s1 of the semiconductor layer 30S via the contact hole CNT2.

Figure 30:
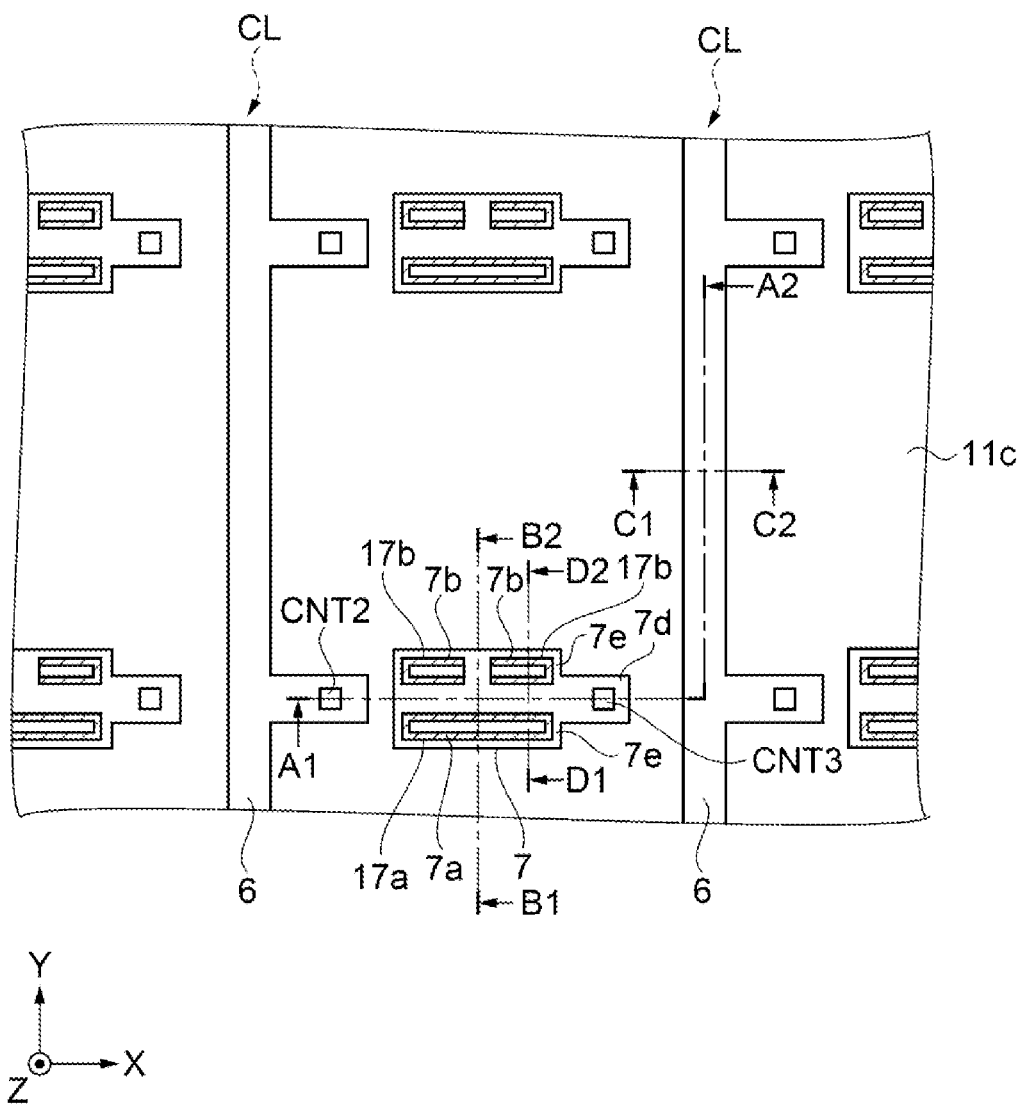
FIG. 30 is a schematic plan view illustrating the method for manufacturing the element substrate.

The second relay layer 7 is provided in an independent island shape in plan view (see FIG. 30). The second relay layer 7 is electrically coupled to the other source drain region s5 of the semiconductor layer 30S via the contact hole CNT3.

In addition, the second relay layer 7 functions as a first light shielding wall 7a and a second light shielding wall 7b, by covering side surfaces and bottom surfaces of a first slit 17a as a recessed portion and a second slit 17b as a recessed portion provided along the scanning line 3 (see FIG. 30). The first light shielding wall 7a and the second light shielding wall 7b shield light mainly from the ±Z directions and oblique directions thereof, the ±Y directions and oblique directions thereof.

The first light shielding wall 7a and the second light shielding wall 7b are disposed on both sides in the ±Y directions (second directions) with the TFT 30 interposed therebetween. Specifically, the first light shielding wall 7a and the second light shielding wall 7b are disposed on both the sides in the ±Y directions (second directions) with at least the LDD regions s2 and s4 of the semiconductor layer 30S interposed therebetween. Thus, since the light shielding walls 7a and 7b are disposed on both the sides in the second directions, with the LDD regions s2 and s4 that easily affect characteristics of the TFT 30 interposed therebetween, it is possible to prevent light from entering the LDD regions s2 and s4. The light shielding by the structure in which the semiconductor layer 30S is disposed along the scanning line 3 in an overlapping manner can be enhanced.

The first slit 17a and the second slit 17b are formed by penetrating the second interlayer insulating layer 11c, the gate insulating layer 11b, and the first interlayer insulating layer 11a, and digging the substrate 10s. In other words, the light shielding walls 7a and 7b are disposed from an upper layer of the gate electrode 30G to a lower layer of the scanning line 3. Thus, light incident from above the TFT 30 can be shielded by the light shielding walls 7a and 7b. Furthermore, light reflected on a side of the substrate 10s (that is, rear surface reflection) can be shielded, and light incident on the TFT 30 can be suppressed.

A forming material of the data line 6, the second relay layer 7, the light shielding walls 7a, and 7b is not particularly limited as long as the material is a low-resistance wiring material having electrical conductivity, but examples include metal such as aluminum (Al) and titanium (Ti), and metallic compounds thereof, for example. In the present exemplary embodiment, the data line 6 and the second relay layer 7 have four-layer structure of titanium (Ti) layer/titanium nitride (TiN) layer/aluminum (Al) layer/titanium nitride (TiN) layer. A thickness of each of the data line 6 and the second relay layer 7 is, for example, approximately 350 nm.

The third interlayer insulating layer 12 is provided covering the data line 6, the second relay layer 7, the light shielding walls 7a, 7b, and the like. A forming material similar to that of the first interlayer insulating layer 11a is employed for the third interlayer insulating layer 12, for example. In the present exemplary embodiment, silicon oxide is used for the third interlayer insulating layer 12. A thickness of the third interlayer insulating layer 12 is approximately 400 nm, for example.

Contact holes CNT4 and CNT5 are provided in the third interlayer insulating layer 12. The contact hole CNT4 penetrates the second interlayer insulating layer 11c and the third interlayer insulating layer 12, and electrically couples the second upper capacitance electrode 4 of the capacitance element 16 and the capacitance line 8.

The contact hole CNT5 penetrates the third interlayer insulating layer 12, and electrically couples the second relay layer 7 and a first relay layer 9.

The capacitance line 8 and the first relay layer 9 are provided in the fifth layer above the fourth layer. The capacitance line 8 overlaps the data line 6 extending in the ±Y directions in plan view (see FIG. 32, FIG. 33). Although not illustrated, the capacitance line 8 is electrically coupled to the vertical conduction portion 106 of the counter substrate 20 described above. As a result, the capacitance line 8 is electrically coupled to the counter electrode 21 and is provided with common potential. As a result, the capacitance line 8 prevents effects of potential of the data line 6 and the scanning line 3 from affecting the pixel electrode 15. The capacitance line 8 is also electrically coupled to the first upper capacitance electrode 16c of the capacitance element 16 and the second upper capacitance electrode 4, via the contact hole CNT4.

Figure 34:
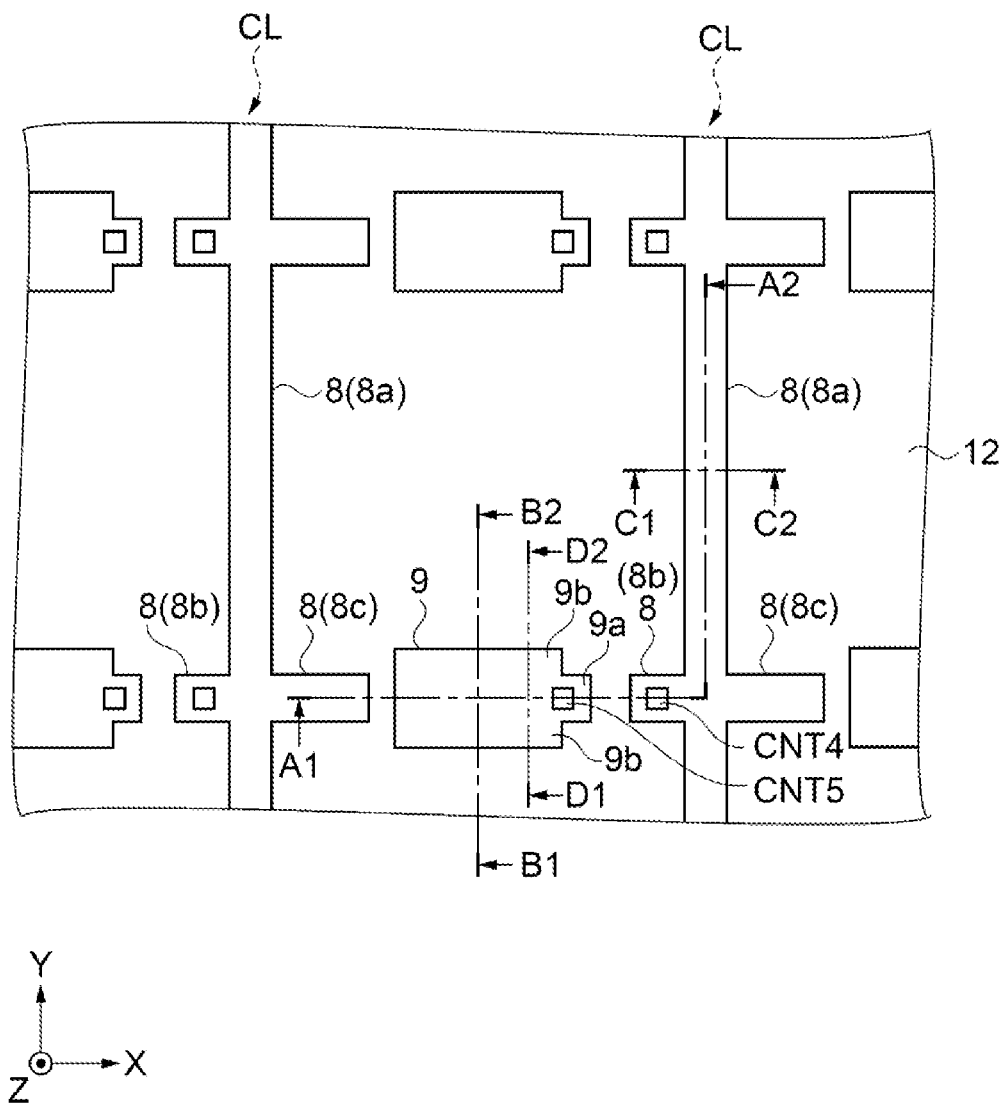
FIG. 34 is a schematic plan view illustrating the method for manufacturing the element substrate.

The first relay layer 9 is provided in an independent island shape in plan view (see FIG. 34). The first relay layer 9 is electrically coupled to the second relay layer 7 via the contact hole CNT5.

A forming material of the capacitance line 8 and the first relay layer 9 is, similar to the data line 6, not particularly limited as long as the material is a low-resistance wiring material having electrical conductivity, but examples include metal such as aluminum (Al) and titanium (Ti), and metallic compounds thereof, for example. In the present exemplary embodiment, the capacitance line 8 and the first relay layer 9 have four-layer structure of titanium (Ti) layer/titanium nitride (TiN) layer/aluminum (Al) layer/titanium nitride (TiN) layer. A thickness of each of the capacitance line 8 and the first relay layer 9 is, for example, approximately 250 nm.

The fourth interlayer insulating layer 13 is provided covering the capacitance line 8 and the first relay layer 9. Examples of a forming material of the fourth interlayer insulating layer 13 include a silicon-based oxide film similar to the first interlayer insulating layer 11a, for example. In the present exemplary embodiment, silicon oxide is used for the fourth interlayer insulating layer 13. A thickness of the fourth interlayer insulating layer 13 is approximately 300 nm, for example.

A contact hole CNT6 is provided in the fourth interlayer insulating layer 13. The contact hole CNT6 electrically couples the first relay layer 9 and the pixel electrode 15. The contact hole CNT6 overlaps the contact hole CNT1 in plan view (see FIG. 22 and FIG. 36).

The pixel electrode 15 is provided in the sixth layer above the fifth layer. The pixel electrode 15 is electrically coupled to the other source drain region s5 that also serves as a lower capacitance electrode of the capacitance element 16, via the contact hole CNT6, the first relay layer 9, the contact hole CNT5, the second relay layer 7, and the contact hole CNT3. The pixel electrode 15 is provided by forming a transparent conductive film made of ITO, IZO, or the like, for example, and then performing patterning. In the present exemplary embodiment, ITO is used for the pixel electrode 15. A thickness of the pixel electrode 15 is approximately 145 nm, for example.

Although not illustrated, the alignment film 18 is provided covering the pixel electrode 15. The alignment film 18 of the element substrate 10, and the alignment film 22 of the counter substrate 20 described above are each formed of a collection of columns in each of which an inorganic material such as silicon oxide is deposited and grown in a columnar shape from a predetermined direction such as an oblique direction. In addition, liquid crystal molecules included in the liquid crystal layer 50 illustrated in FIG. 2 have negative dielectric anisotropy with respect to the alignment films 18 and 22.

Next, a method for manufacturing the liquid crystal device 100 will be described below with reference to FIG. 6 to FIG. 38.

Figure 6:
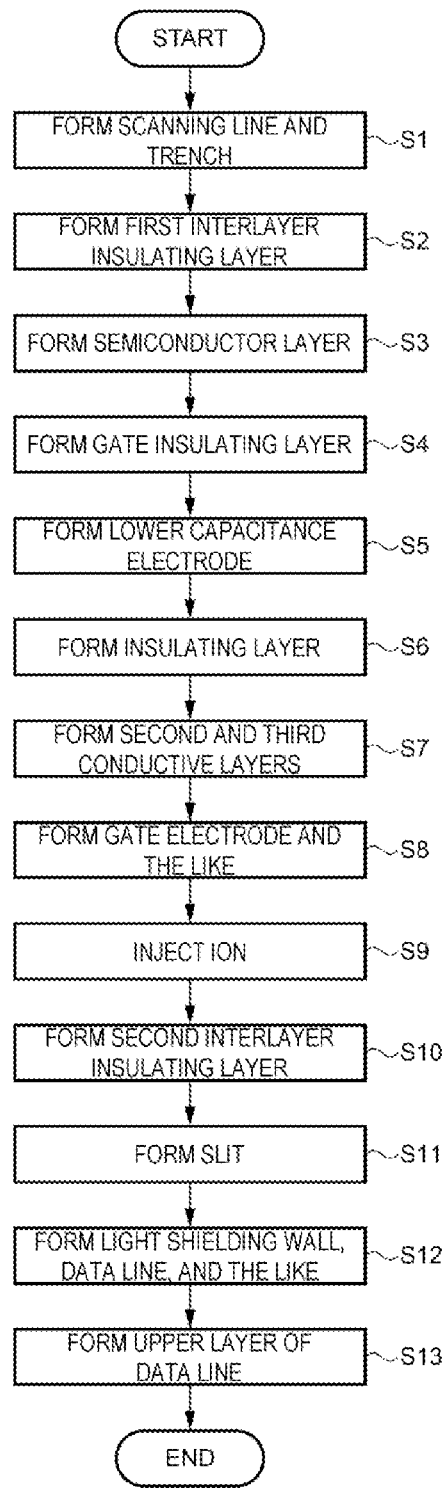
FIG. 6 is a process flow diagram illustrating a method for manufacturing the element substrate of a method for manufacturing the liquid crystal device.

FIG. 6 is a process flow diagram illustrating a method for manufacturing the element substrate 10 of the method for manufacturing the liquid crystal device 100. FIG. 7, FIG. 9, FIG. 11, FIG. 13, FIG. 15A, FIG. 15B, FIG. 17, FIG. 19A, FIG. 19B, FIG. 21, FIG. 23, FIG. 25, FIG. 27, FIG. 29, FIG. 31, FIG. 33, FIG. 35, and FIG. 37 are schematic cross-sectional views illustrating the method for manufacturing the element substrate 10. FIG. 8, FIG. 10, FIG. 12, FIG. 14, FIG. 16, FIG. 18, FIG. 20, FIG. 22, FIG. 24, FIG. 26, FIG. 28, FIG. 30, FIG. 32, FIG. 34, FIG. 36, and FIG. 38 are schematic plan views illustrating the method for manufacturing the element substrate 10. In the following description, see also FIG. 5.

Here, in the schematic cross-sectional views described above, in the same manner as in FIG. 5, four cross sections corresponding to the line segment A1-A2, the line segment C1-C2, the line segment B1-B2, and the line segment D1-D2 illustrated in FIG. 4 (note that, FIG. 25 and later) are illustrated side by side. Furthermore, in the schematic plan views described above, a periphery of one opening region OP illustrated in FIG. 4 is enlarged and illustrated. Note that, hereinafter, unless otherwise indicated, a state in plan view will be described in the description of the schematic plan view.

The method for manufacturing the liquid crystal device 100 of the present exemplary embodiment includes the method for manufacturing the element substrate 10 described below, and known techniques can be employed except for steps included in the method for manufacturing the element substrate 10. Therefore, in the following description, only the method for manufacturing the element substrate 10 will be described. Also, in the method for manufacturing the element substrate 10, known techniques can be employed unless otherwise indicated.

As illustrated in FIG. 6, the method for manufacturing the element substrate 10 of the present exemplary embodiment includes steps S1 to S13. Hereinafter, each step from step S1 to step S13 will be described. Note that, the process flow illustrated in FIG. 6 is an example and the present disclosure is not limited thereto.

Figure 7:
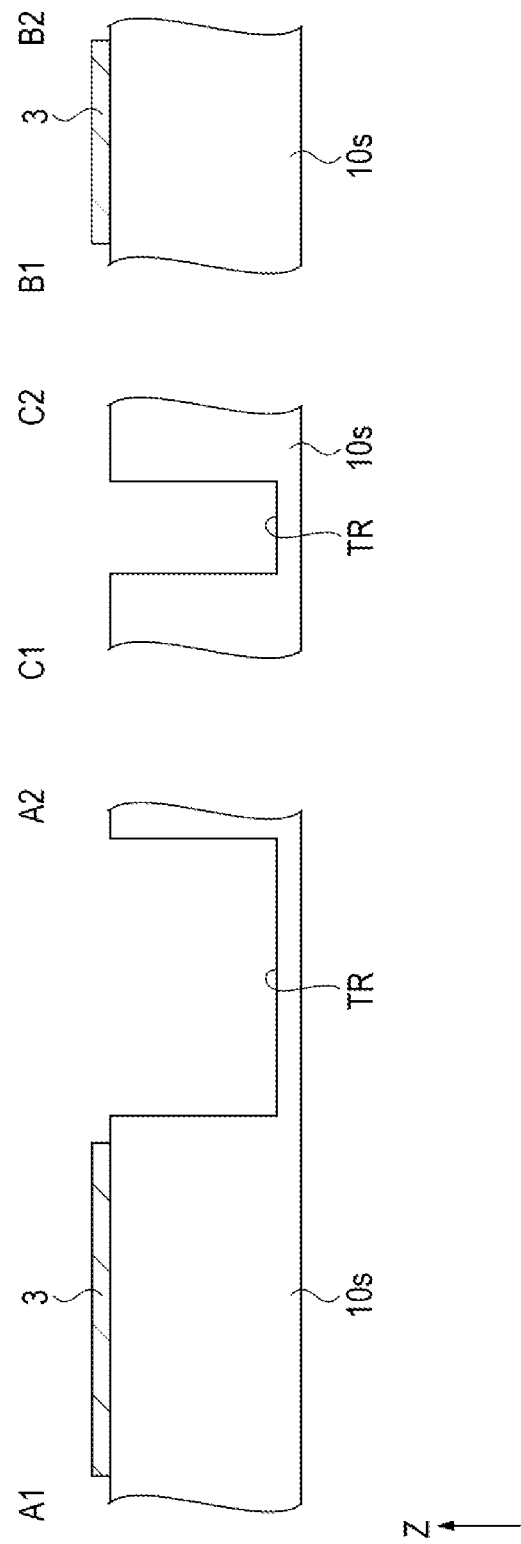
FIG. 7 is a schematic cross-sectional view illustrating the method for manufacturing the element substrate.
Figure 8:
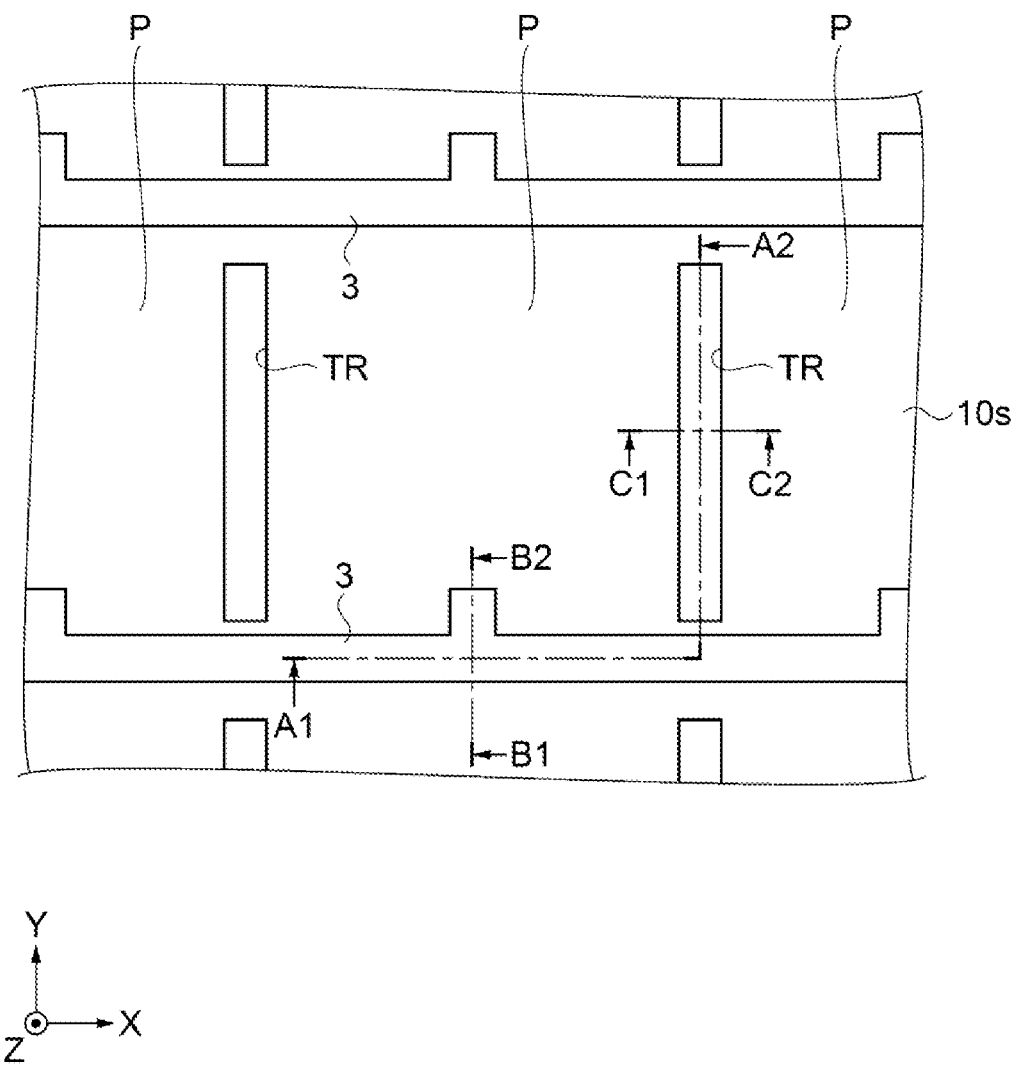
FIG. 8 is a schematic plan view illustrating the method for manufacturing the element substrate.

In step S1, as illustrated in FIG. 7 and FIG. 8, the scanning line 3, and the trench TR are formed at the substrate 10s. First, the scanning line 3 is provided at the substrate 10s. The scanning line 3 has a part extending in the ±X directions, and a part protruding from the above part in the +Y directions. The contact hole CNT1 is provided in the part protruding in the +Y direction (see FIG. 20). Patterning forming using, for example, a photolithography method is used for forming the scanning line 3.

Next, the trench TR is provided. The trench TR is present between the pixels P adjacent to each other in the ±X directions, and is a recessed portion having a substantially rectangular shape that is accommodated in the closed region CL. The trench TR has a depth in the ±Z directions of approximately 3 μm, and a width in the ±X directions of approximately 1 μm. Wet etching using a hard mask is used to form the trench TR, for example. Then, the processing proceeds to step S2.

Figure 9:
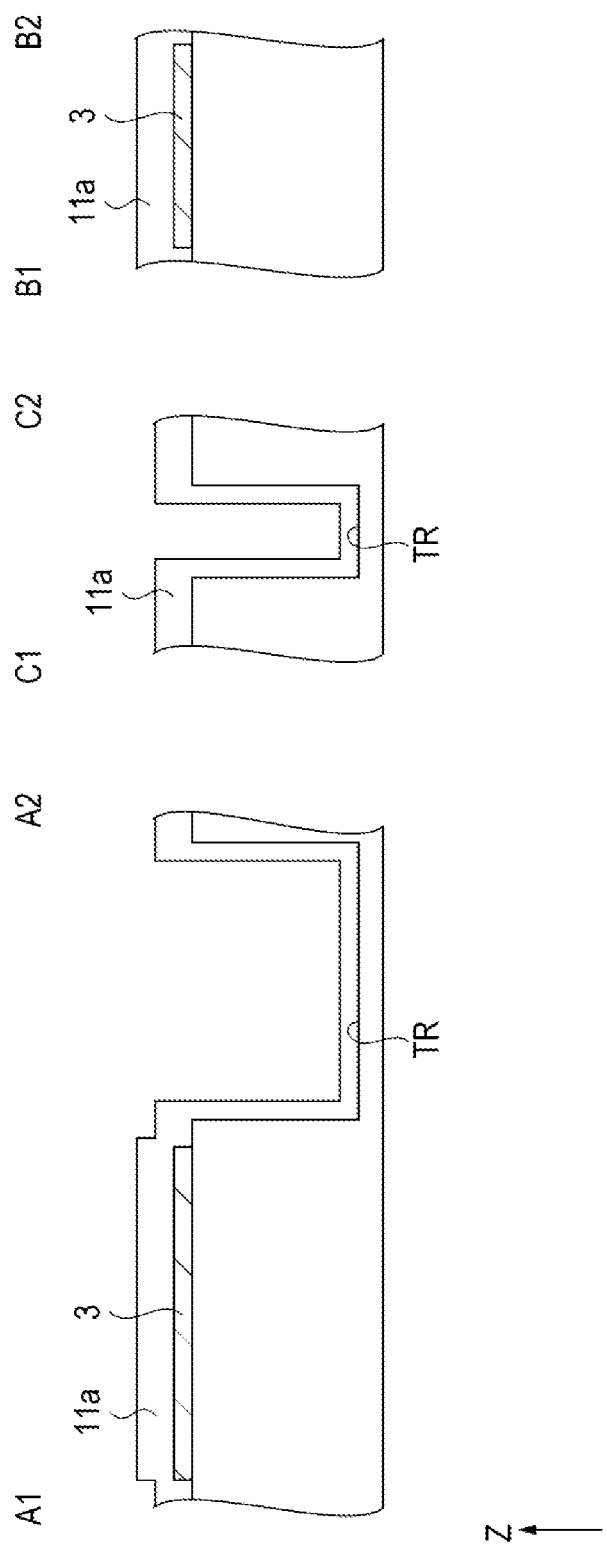
FIG. 9 is a schematic cross-sectional view illustrating the method for manufacturing the element substrate.
Figure 10:
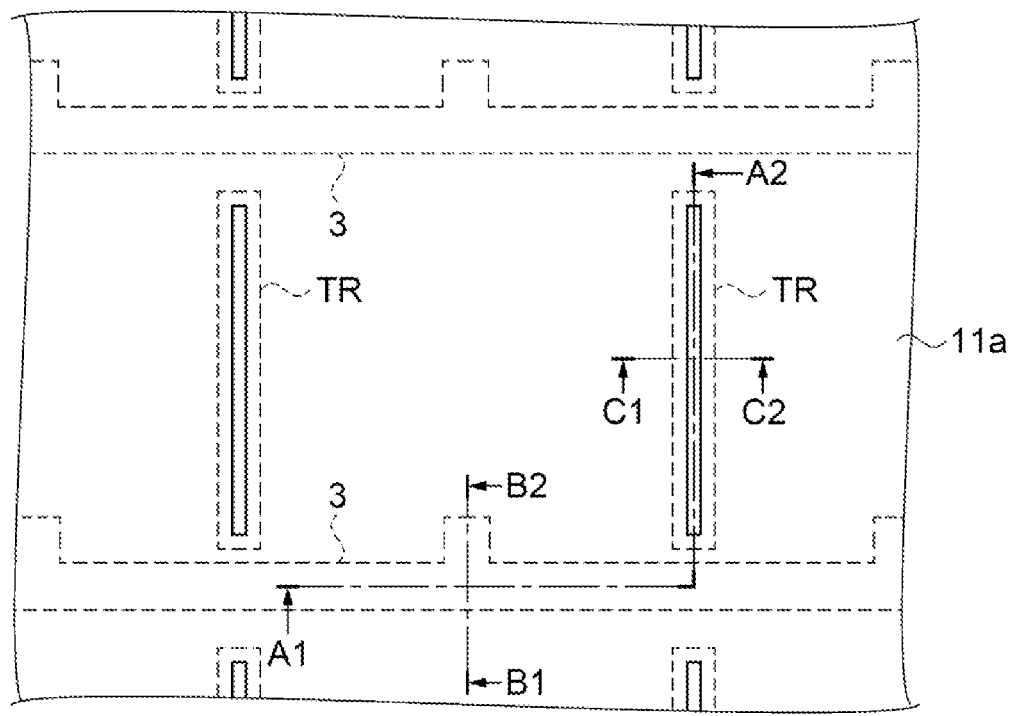
FIG. 10 is a schematic plan view illustrating the method for manufacturing the element substrate.

In step S2, as illustrated in FIG. 9 and FIG. 10, the first interlayer insulating layer 11a is provided in a solid form at the substrate 10s including the scanning line 3 and the inside of the trench TR. For forming the first interlayer insulating layer 11a, an atmospheric pressure CVD (Chemical Vapor Deposition) method, a low-pressure CVD method, or a plasma CVD method using a processing gas such as monosilane ($SiH_4$), dichlorosilane ($SiH_2Cl_2$), tetraethoxysilane (TEOS), or ammonia ($NH_3$) is used, for example.

At this time, the inside of the trench TR is also covered by the first interlayer insulating layer 11a, to adjust forming conditions so that a width of the recessed portion in the ±X directions is decreased. The width in the ±X directions of the recessed portion covered by the first interlayer insulating layer 11a is less than the width in the ±X directions of the trench TR at the time of formation by wet etching. For example, the width in the ±X directions of the recessed portion is approximately 0.3 μm, with respect to the width in the ±X directions at the time of formation of the trench TR of approximately 1 μm. As a result, the width in the ±X directions of the capacitance element 16 provided in the trench TR can be decreased, and the capacitance element 16 can be accommodated in the closed region CL. Furthermore, the trench TR is filled with the capacitance element 16 and the like provided in the trench TR. Therefore, the data line 6 and the like provided in the upper layer do not fall into indentation originating from the trench TR, and disconnection of the data line 6 or the like can be prevented. Then the processing proceeds to step S3.

Figure 11:
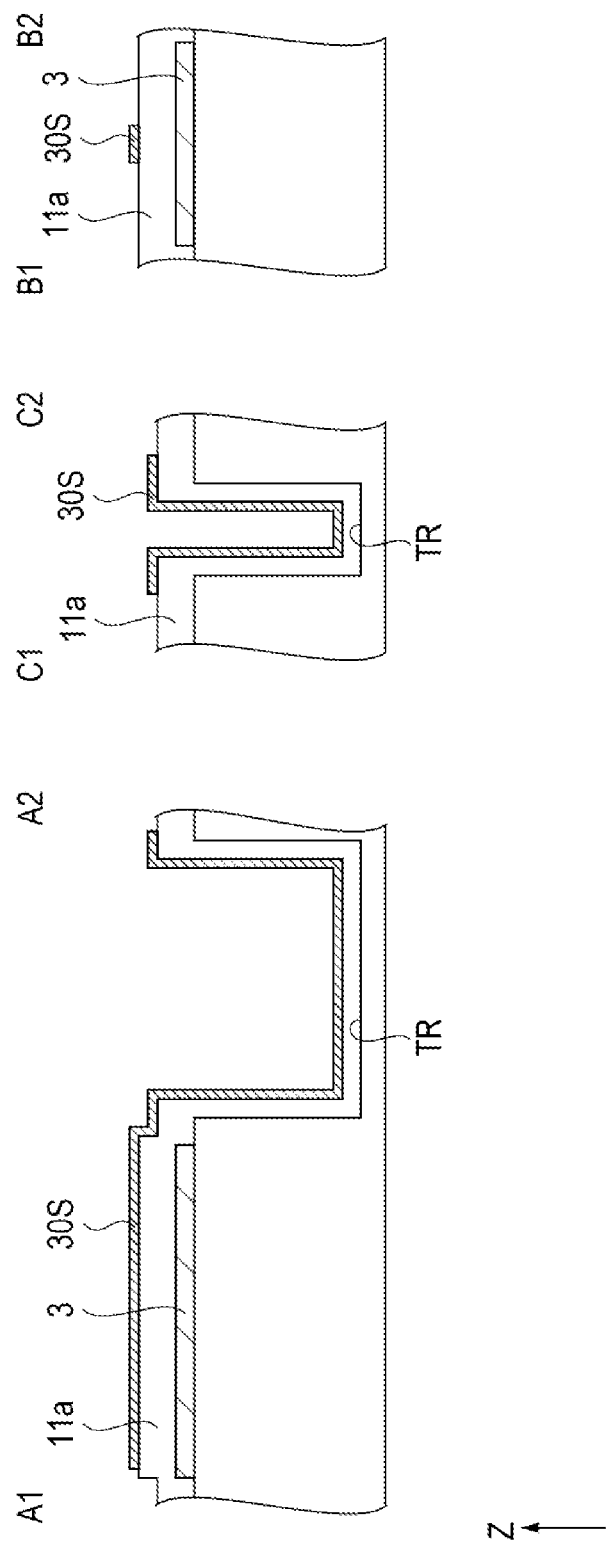
FIG. 11 is a schematic cross-sectional view illustrating the method for manufacturing the element substrate.
Figure 12:
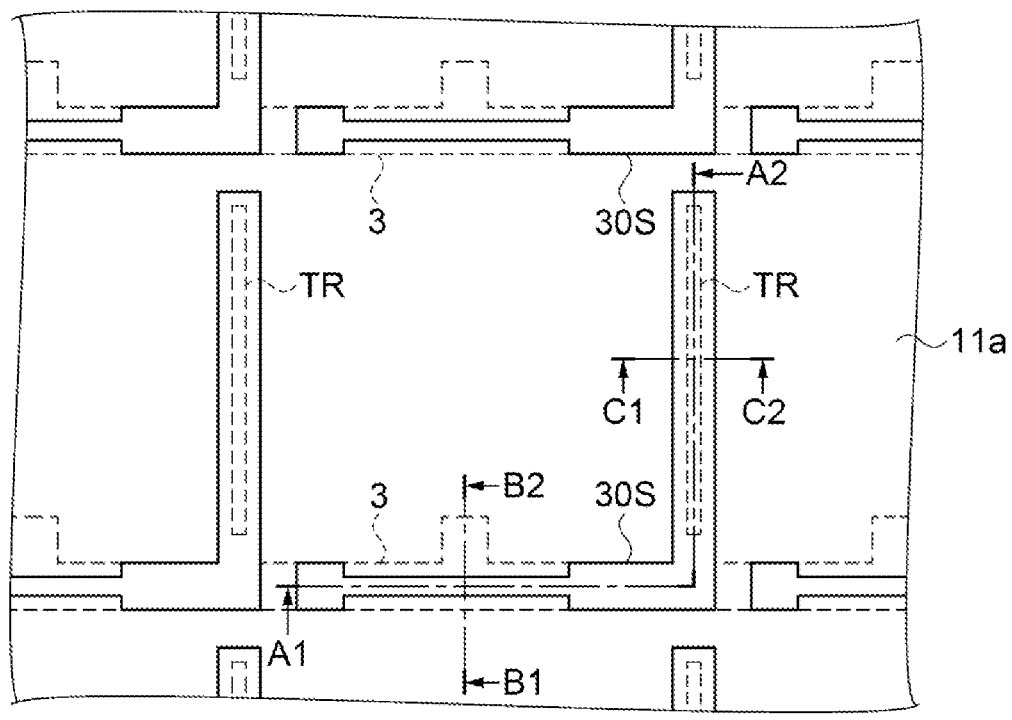
FIG. 12 is a schematic plan view illustrating the method for manufacturing the element substrate.

In step S3, the semiconductor layer 30S is provided at the first interlayer insulating layer 11a including the inside of the trench TR. The semiconductor layer 30S is a polysilicon film, and is formed by being patterned as illustrated in FIG. 11 and FIG. 12 using a low-pressure CVD method or the like for forming.

The semiconductor layer 30S is provided bent in the ±Y directions from the ±X directions. Although not illustrated, the semiconductor layer 30S is disposed overlapping the closed region CL. Then the processing proceeds to step S4.

Figure 13:
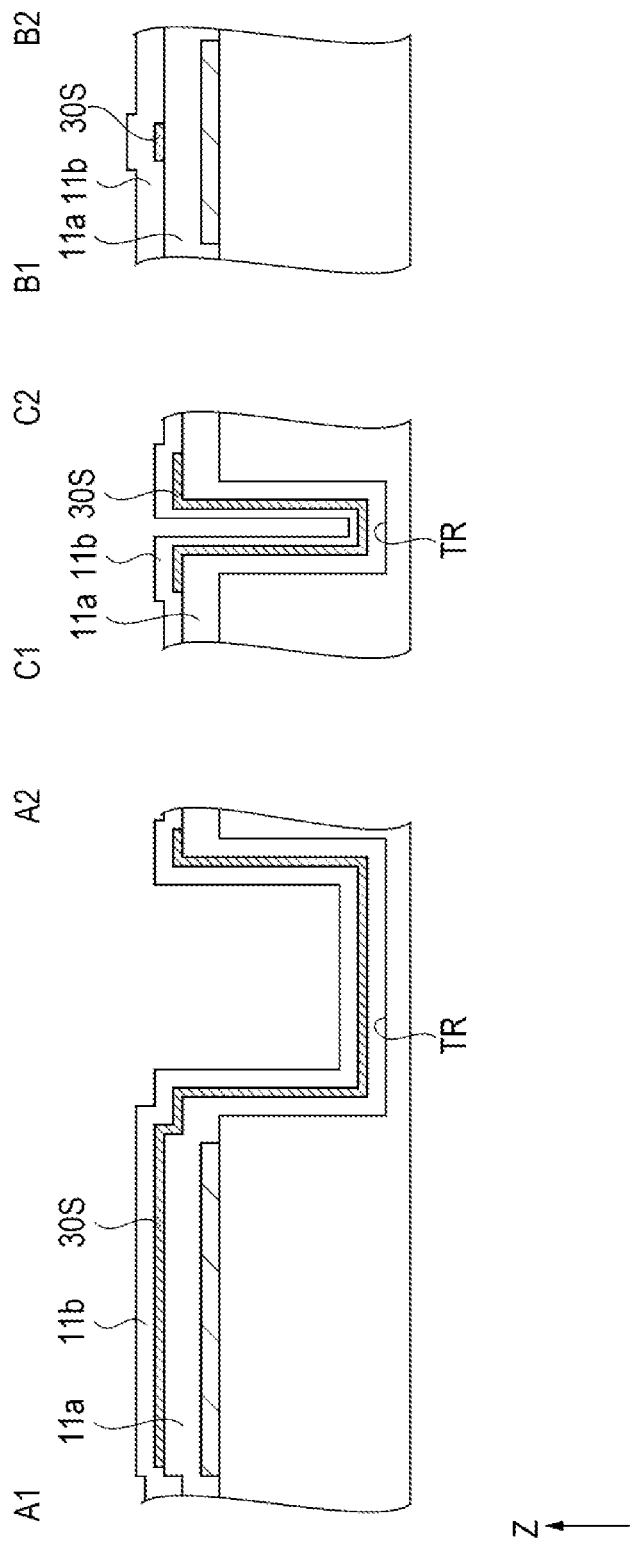
FIG. 13 is a schematic cross-sectional view illustrating the method for manufacturing the element substrate.
Figure 14:
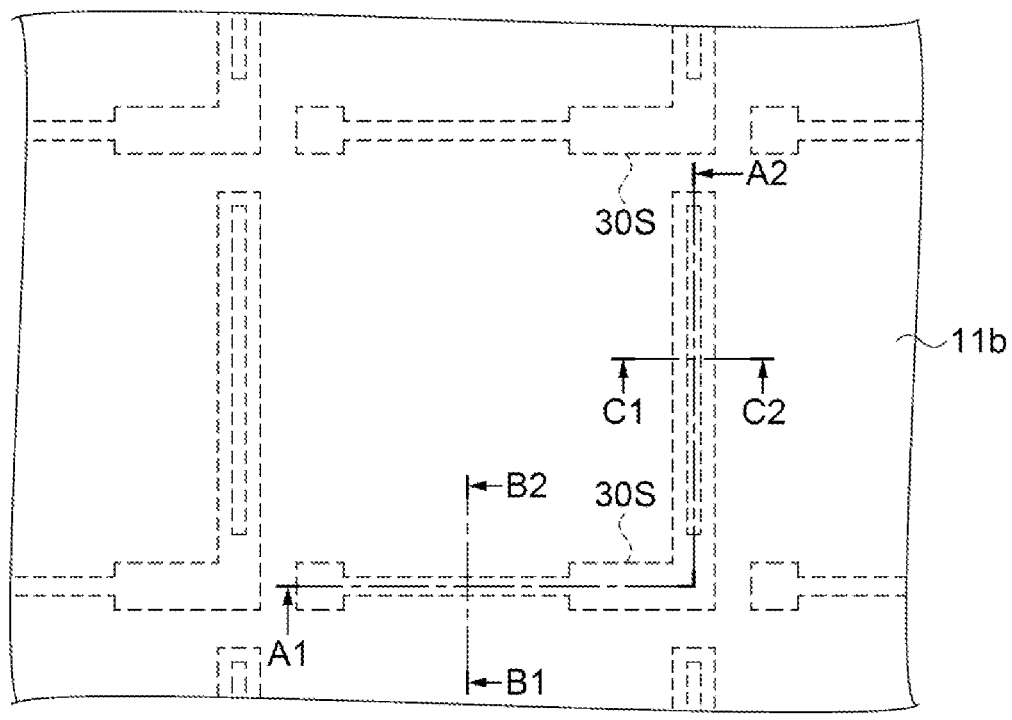
FIG. 14 is a schematic plan view illustrating the method for manufacturing the element substrate.

In step S4, as illustrated in FIG. 13 and FIG. 14, the gate insulating layer 11b is provided in a solid form at the semiconductor layer 30S and the first interlayer insulating layer 11a. When, for example, double structure formed of two types of silicon oxide is employed for the gate insulating layer 11b, a first silicon oxide film obtained by thermal oxidation of a polysilicon film is provided, and then a second silicon oxide film is provided under high temperature conditions from 700° C. to 900° C. using a low-pressure CVD method. At this time, the inside of the trench TR is also covered with the gate insulating layer 11b. Then the processing proceeds to step S5.

Figure 15A:
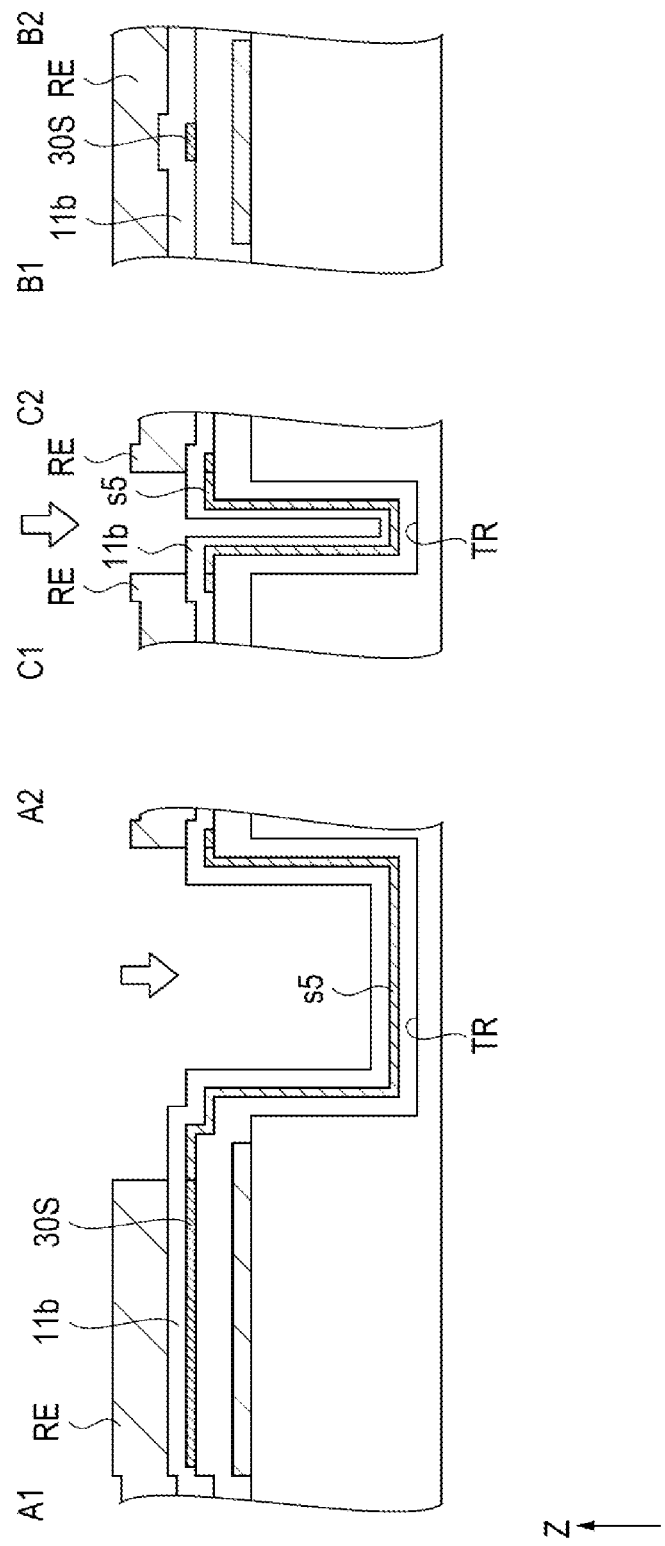
FIG. 15A is a schematic cross-sectional view illustrating the method for manufacturing the element substrate.
Figure 15B:
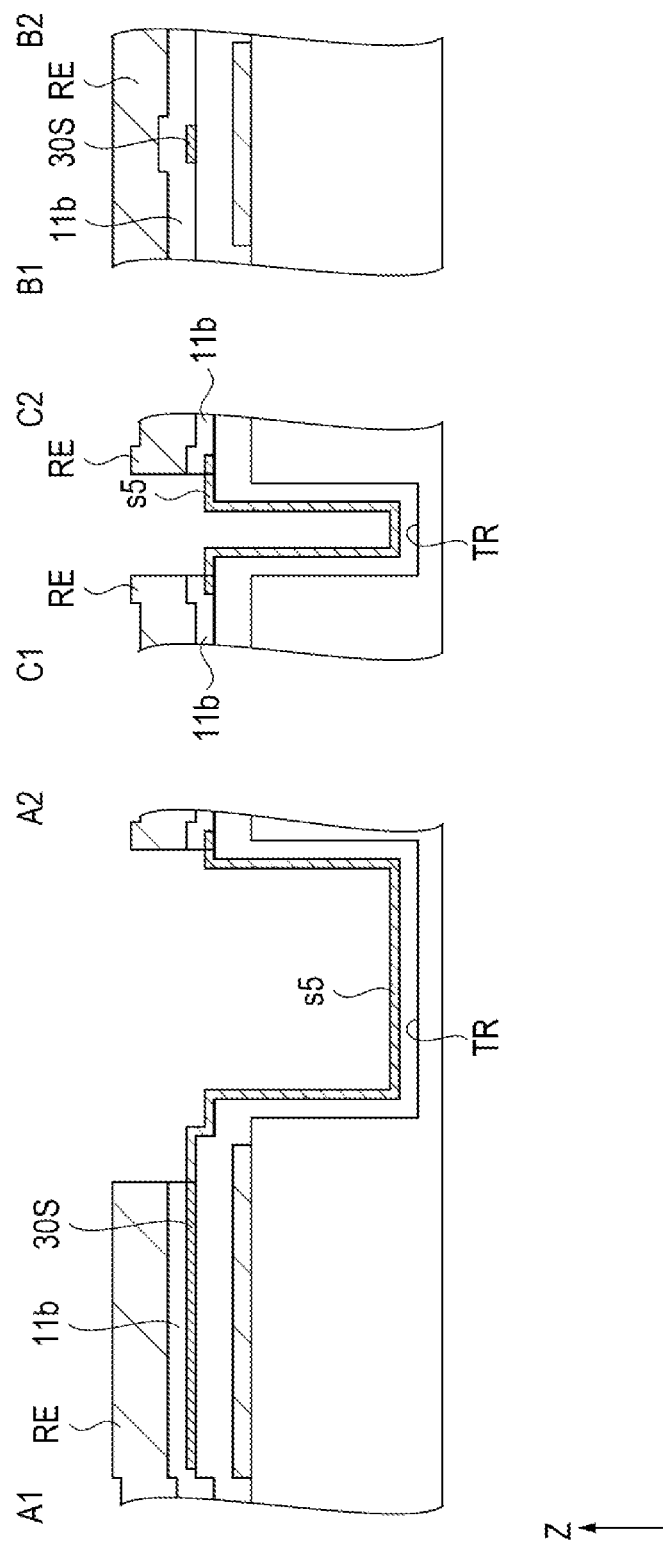
FIG. 15B is a schematic cross-sectional view illustrating the method for manufacturing the element substrate.

In step S5, as illustrated in FIG. 15A, FIG. 15B, and FIG. 16, the other source drain region s5, which is the lower capacitance electrode of the capacitance element 16 is formed. First, a resist RE is formed in a region excluding the inside of the trench TR and the edge of the trench TR. The region where the resist RE is not disposed corresponds to a part, which functions as the lower capacitance electrode of the capacitance element 16, of the other source drain region s5 of the semiconductor layer 30S.

Next, ion injection is performed in the semiconductor layer 30S. First, electrical conductivity is given to the semiconductor layer 30S in the inside of the trench TR and at the edge of the trench TR, which are the regions where the resist RE is not disposed. At this time, an ion is injected into the semiconductor layer 30S via the gate insulating layer 11b. As a result, as illustrated in FIG. 15A, the semiconductor layer 30S in the inside of the trench TR and at the edge of the trench TR becomes the other source drain region s5. The ion injected is, for example, phosphorus (P).

Next, the gate insulating layer 11b in the inside of the trench TR and at the edge of the trench TR on which the resist RE is not disposed is removed by wet etching. Thereafter, all the resist RE is removed. Then the processing proceeds to step S6.

Figure 17:
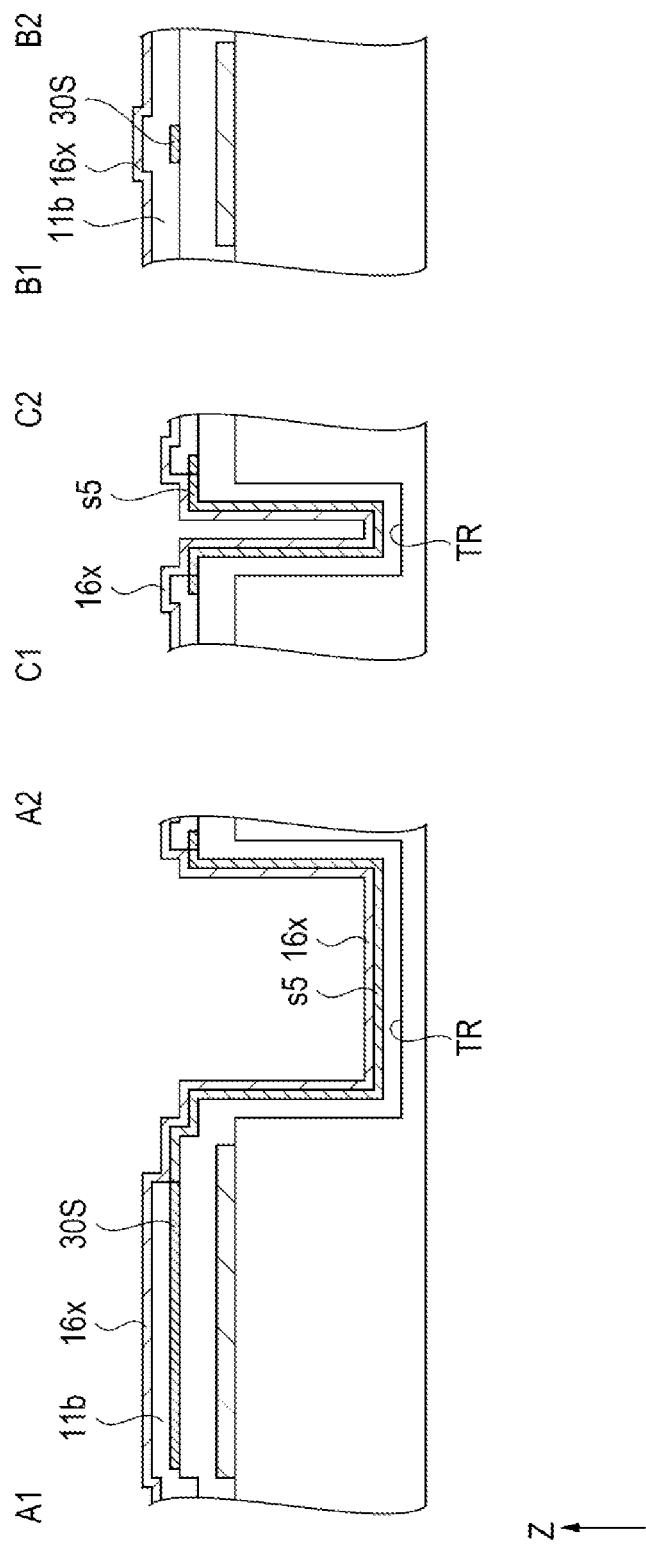
FIG. 17 is a schematic cross-sectional view illustrating the method for manufacturing the element substrate.
Figure 18:
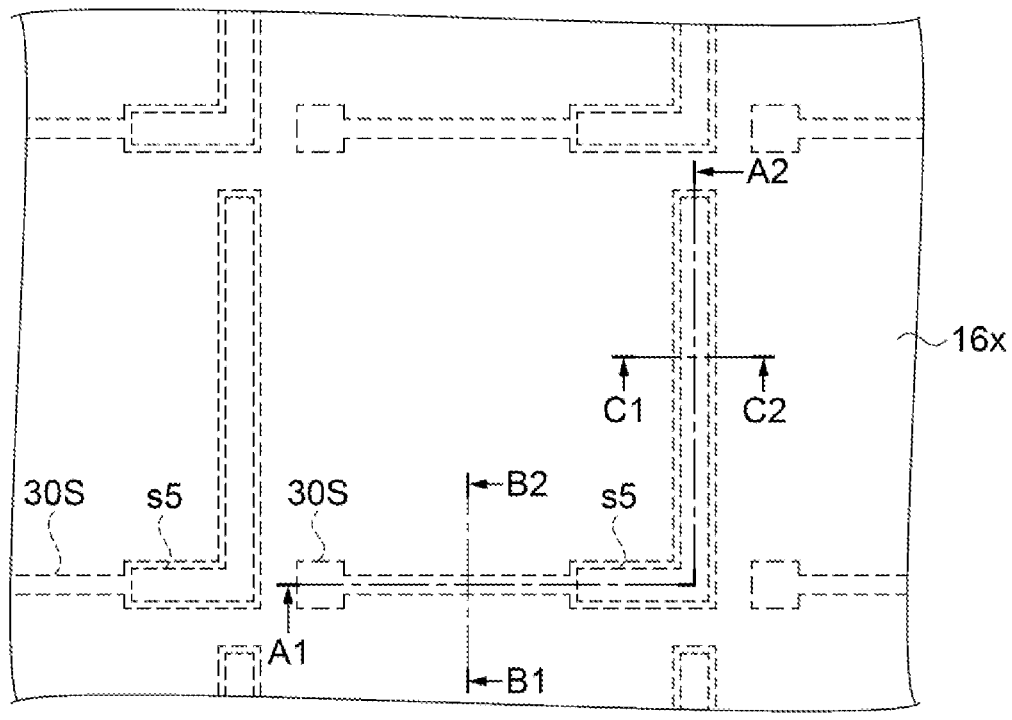
FIG. 18 is a schematic plan view illustrating the method for manufacturing the element substrate.

In step S6, an insulating layer 16x is formed. The insulating layer 16x is a layer that becomes the capacitor insulating layer 16b in the subsequent step. As illustrated in FIG. 17 and FIG. 18, the insulating layer 16x is provided in a solid form at the other source drain region s5 in the inside of the trench TR and at the edge of the trench TR, and at the gate insulating layer 11b. Specifically, the insulating layer 16x is provided by a low-pressure CVD method, a plasma CVD method, or the like using silicon nitride. Then the processing proceeds to step S7.

In step S7, a second conductive layer 16y and a third conductive layer 4x are formed. The second conductive layer 16y is a layer that becomes the first gate electrode g1 and the first upper capacitance electrode 16c in the subsequent step. The third conductive layer 4x is a layer that becomes the second gate electrode g2 and the second upper capacitance electrode 4 in the subsequent step.

First, the second conductive layer 16y is provided in a solid form at the insulating layer 16x. Specifically, after a polycrystalline silicon film is provided by a low-pressure CVD method, phosphorus is injected into the polycrystalline silicon film, and then diffused to form a conductive polysilicon film. Concentration of the phosphorus atoms in the second conductive layer 16y is $1 \times 10^{19}$ pieces/$cm^3$ or greater. At this time, the trench TR needs to be filled up with the second conductive layer 16y.

Figure 19A:
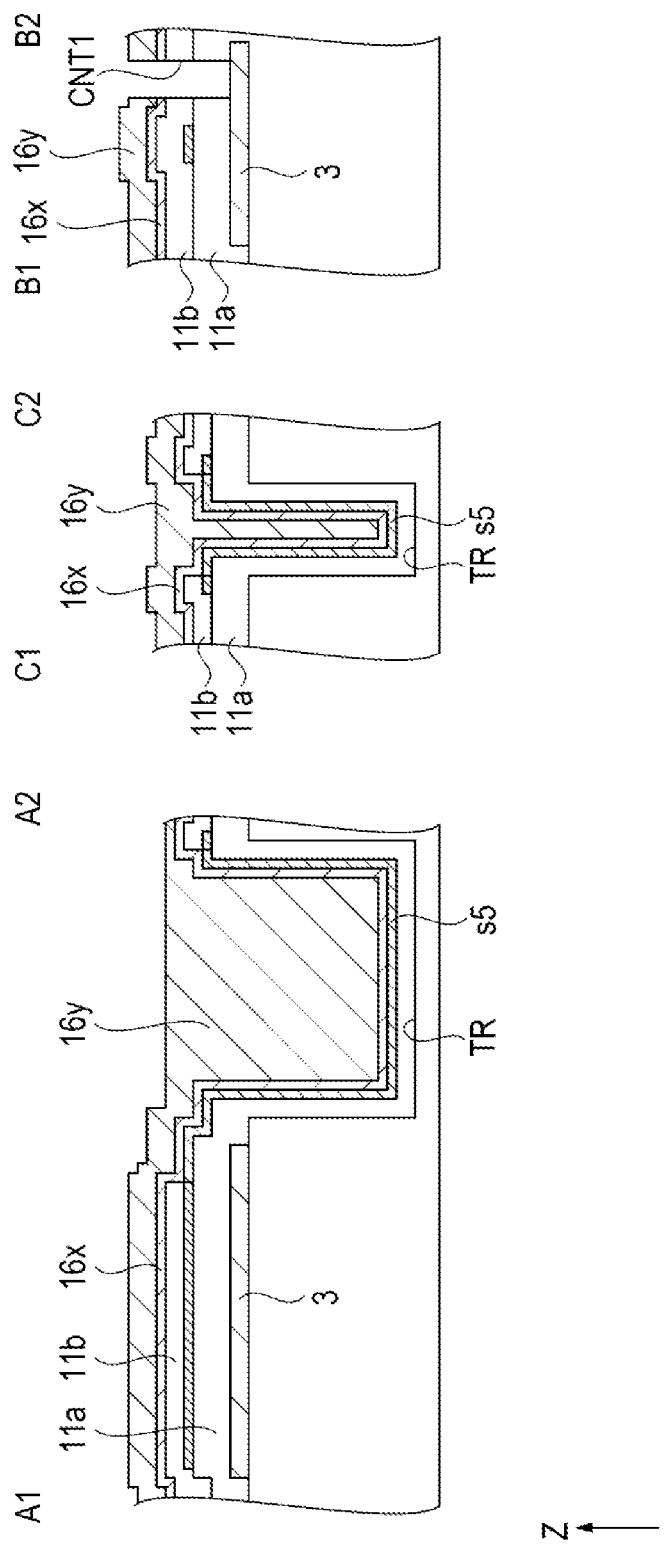
FIG. 19A is a schematic cross-sectional view illustrating the method for manufacturing the element substrate.

Next, as illustrated in FIG. 19A, the contact hole CNT1 is provided that is spaced apart in the +Y direction from the semiconductor layer 30S. The contact hole CNT1 penetrates the second conductive layer 16y, the insulating layer 16x, the gate insulating layer 11b, and the first interlayer insulating layer 11a, and reaches the scanning line 3. For example, dry etching is used to form the contact hole CNT1.

Figure 19B:
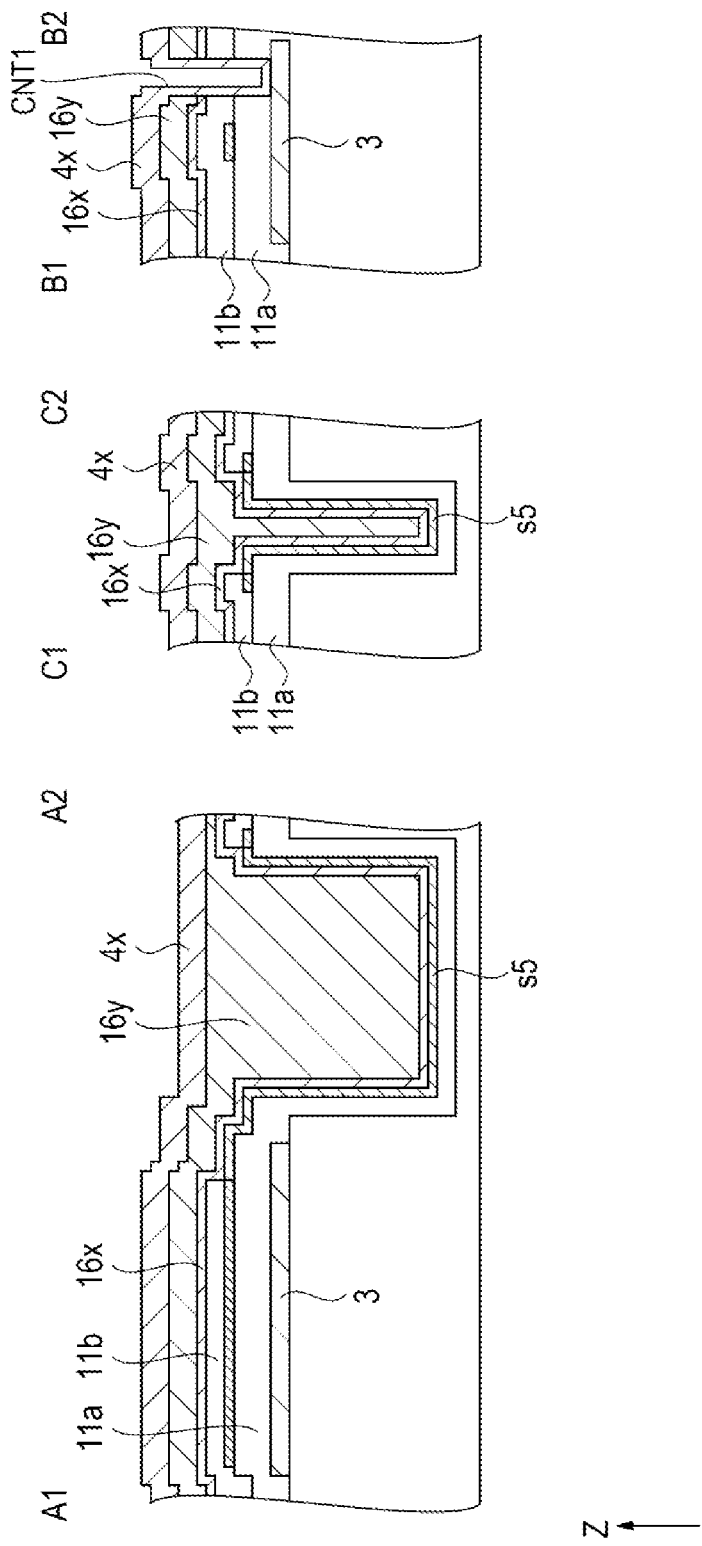
FIG. 19B is a schematic cross-sectional view illustrating the method for manufacturing the element substrate.
Figure 20:
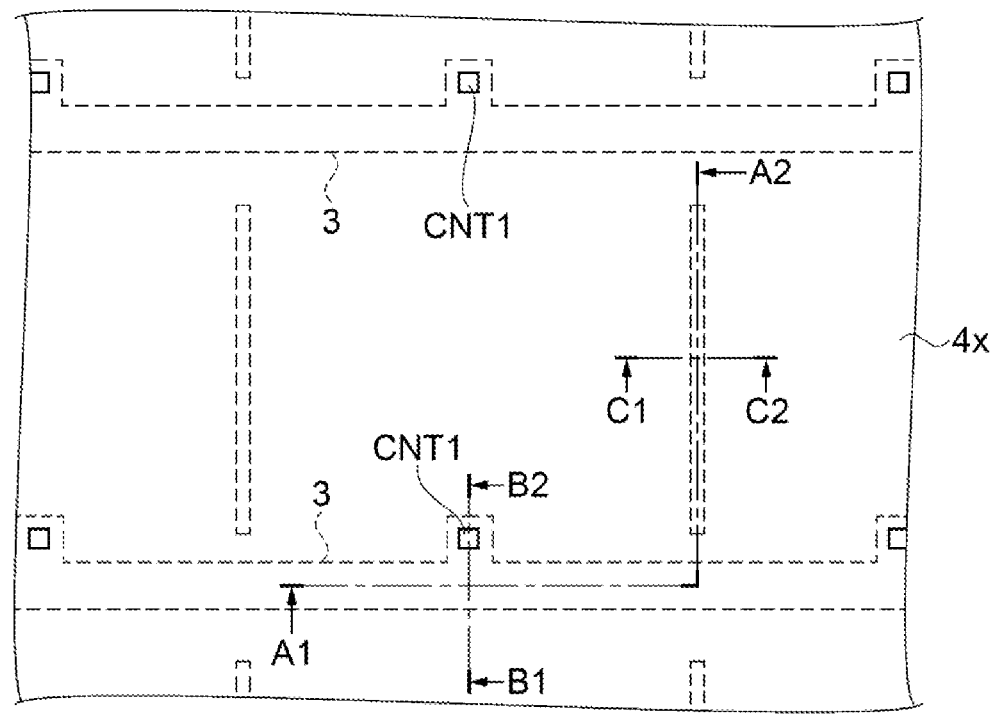
FIG. 20 is a schematic plan view illustrating the method for manufacturing the element substrate.

Next, as illustrated in FIG. 19B and FIG. 20, the third conductive layer 4x is provided in a solid form at the second conductive layer 16y. At this time, the third conductive layer 4x is provided to fill the contact hole CNT1, to electrically couple the scanning line 3 and the third conductive layer 4x. Then the processing proceeds to step S8.

Figure 21:
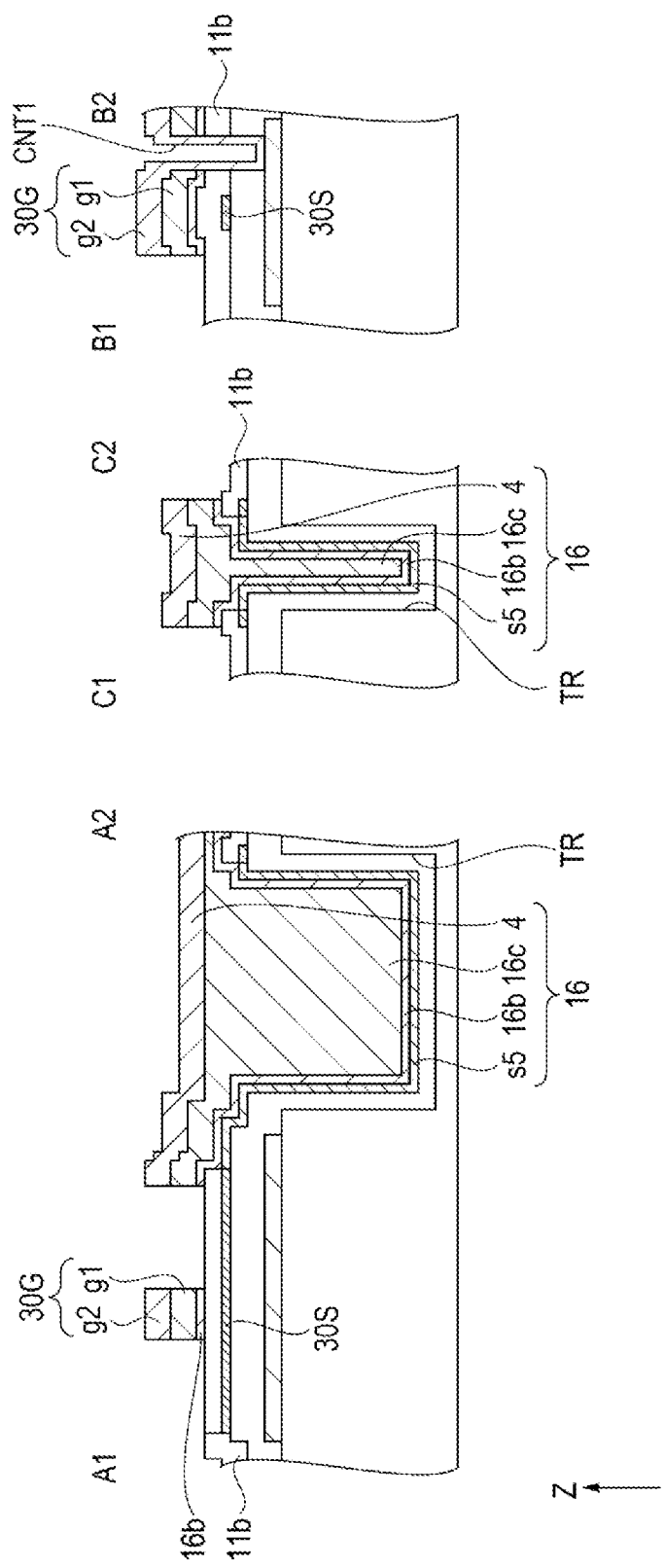
FIG. 21 is a schematic cross-sectional view illustrating the method for manufacturing the element substrate.

In step S8, as illustrated in FIG. 21, the gate electrode 30G, the capacitance element 16, and the like are formed. Specifically, the insulating layer 16x, the second conductive layer 16y, and the third conductive layer 4x are patterned using dry etching.

As a result, the gate electrode 30G including the first gate electrode g1 and the second gate electrode g2 is provided at the gate insulating layer 11b, via the capacitor insulating layer 16b. At this time, in plan view, the insulating layer 16x of silicon nitride is removed in a region other than the gate electrode 30G and the second upper capacitance electrode 4. This facilitates hydrogenation in the semiconductor layer 30S.

By the patterning described above, the capacitance element 16 constituted by a part of the other source drain region s5, the capacitor insulating layer 16b, the first upper capacitance electrode 16c, and the second upper capacitance electrode 4 is also provided.

Figure 22:
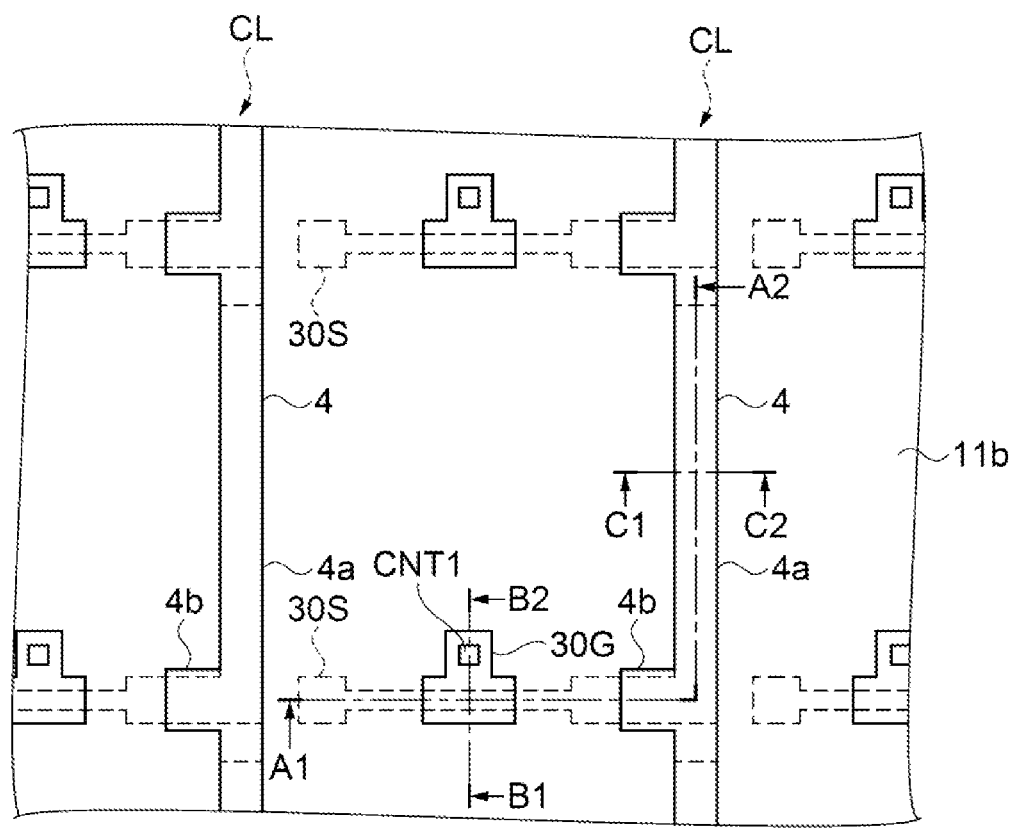
FIG. 22 is a schematic plan view illustrating the method for manufacturing the element substrate.

As illustrated in FIG. 22, the gate electrode 30G is disposed in an island shape in plan view, and includes a part overlapping the contact hole CNT1, and a part (not illustrated) overlapping the semiconductor layer 30S.

The second upper capacitance electrode 4 is provided extending in the ±Y directions so as to overlap the closed region CL extending in the ±Y directions. The second upper capacitance electrode 4 has a main body portion 4a that overlaps the data line 6 provided above and extends in the ±Y directions, and a protruding portion 4b that protrudes in the −X direction from the main body portion 4a. The protruding portion 4b overlaps a part of the semiconductor layer 30S extending in the ±X directions. The capacitor insulating layer 16b and the first upper capacitance electrode 16c are disposed overlapping the second upper capacitance electrode 4. Then the processing proceeds to step S9.

Figure 23:
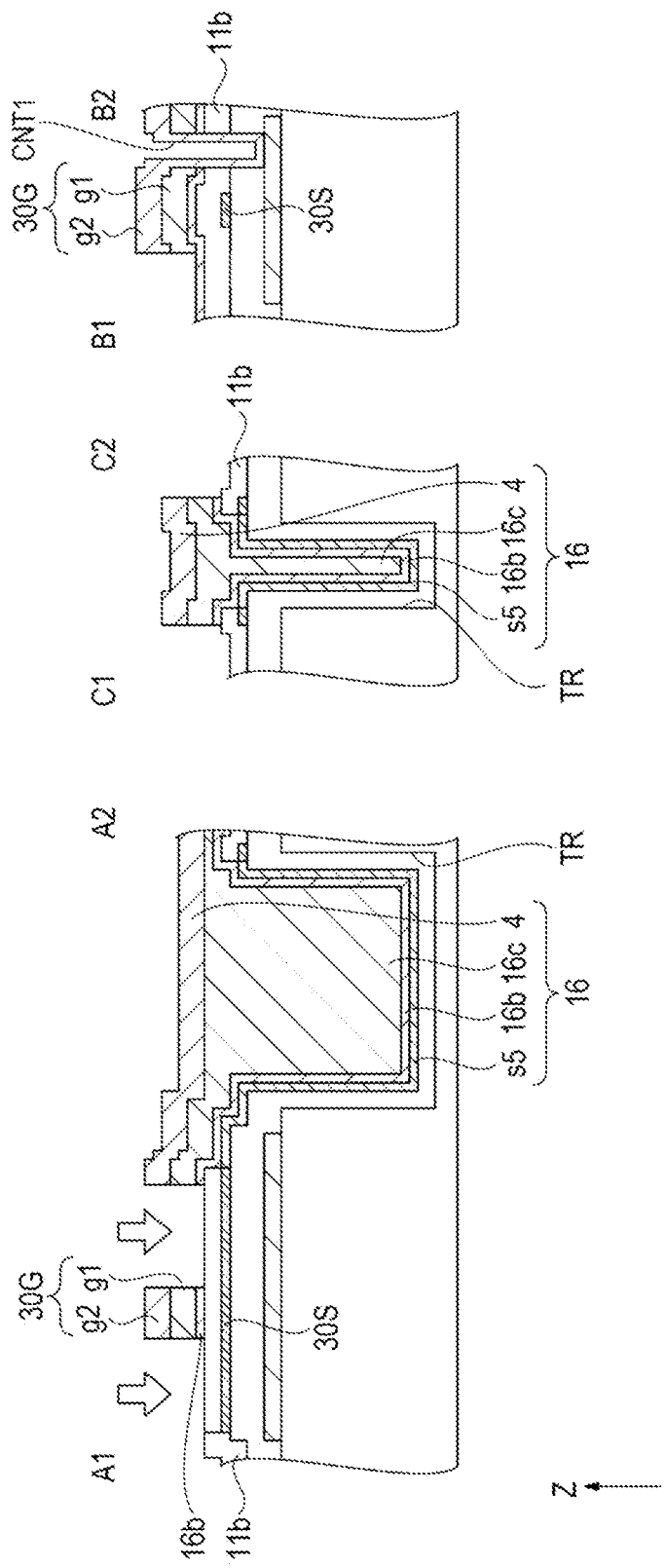
FIG. 23 is a schematic cross-sectional view illustrating the method for manufacturing the element substrate.
Figure 24:
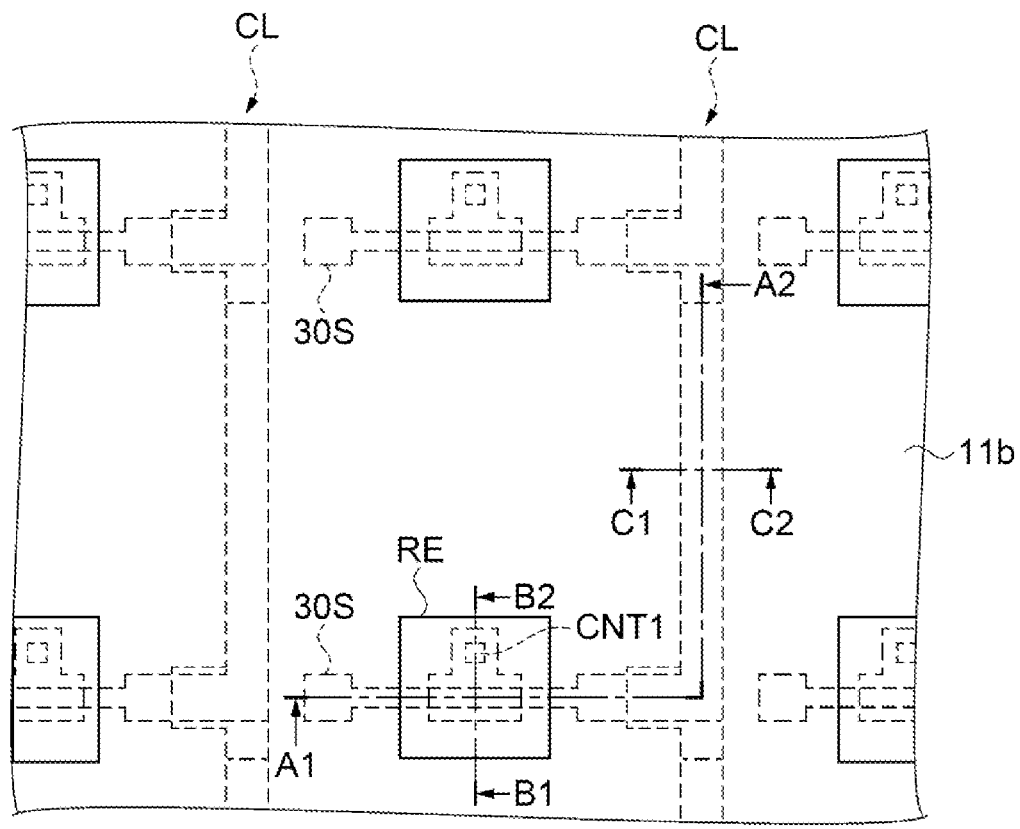
FIG. 24 is a schematic plan view illustrating the method for manufacturing the element substrate.

In step S9, as illustrated in FIG. 23, the one source drain region s1, the LDD regions s2, s4, the channel region s3, and a part of the other source drain region s5 are formed at the semiconductor layer 30S by ion injection. Specifically, injection of medium concentration ion and subsequent injection of high concentration ion are performed in the semiconductor layer 30S.

First, the LDD regions s2 and s4 are provided that sandwiches the channel region s3 in the ±X directions, by the injection of medium concentration ion. Next, the LDD regions s2, s4 and the channel region s3 of the semiconductor layer 30S are masked with a pattern of the resist RE illustrated in FIG. 24, and the injection of high concentration ion is performed into the semiconductor layer 30S other than those. This provides the source drain regions s1 and s5. Then the processing proceeds to step S10.

Figure 25:
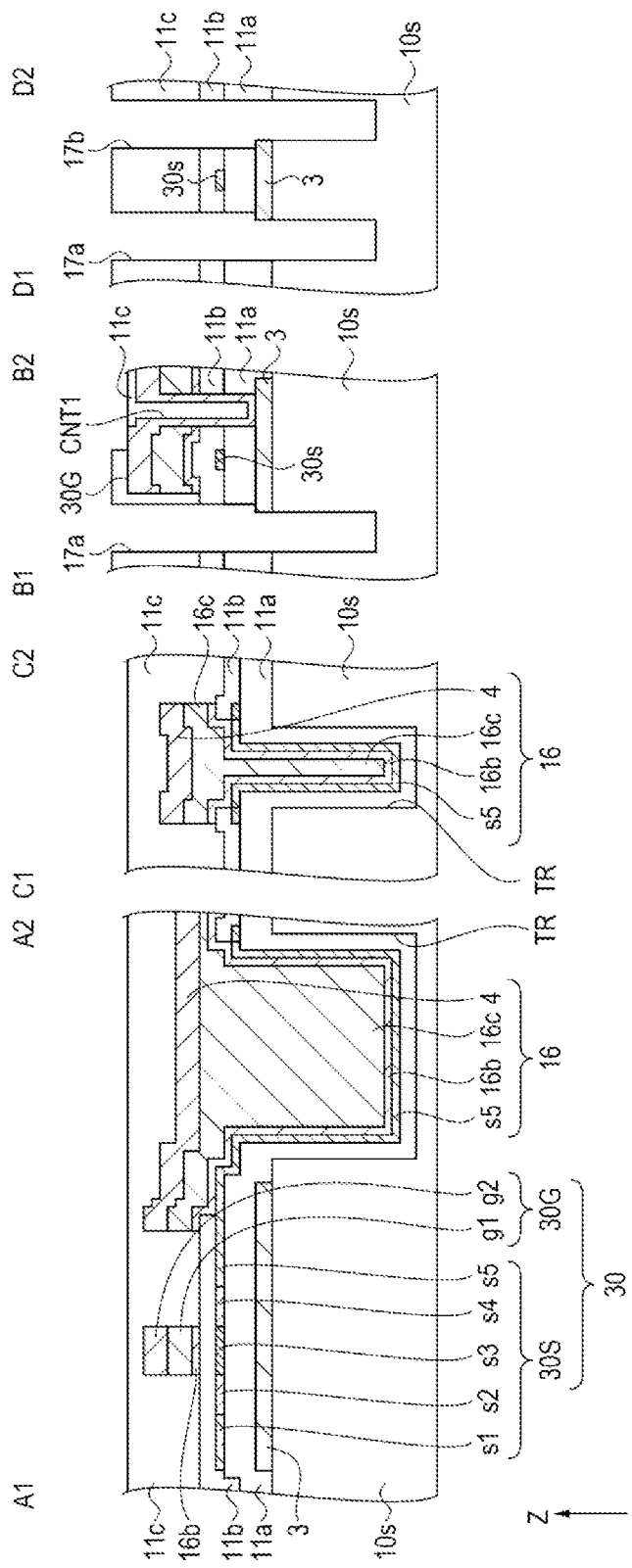
FIG. 25 is a schematic cross-sectional view illustrating the method for manufacturing the element substrate.

In step S10, as illustrated in FIG. 25, the second interlayer insulating layer 11c and the like are formed. First, the second interlayer insulating layer 11c is provided at the second gate electrode g2, the second upper capacitance electrode 4, and the gate insulating layer 11b exposed upward. Examples of a method for forming silicon oxide that is the second interlayer insulating layer 11c include an atmospheric pressure CVD method, a low-pressure CVD method, a plasma CVD method, or the like using, for example, monosilane, dichlorosilane, TEOS, TEB (Triethyl Borate), and the like.

Impurity activation annealing is then performed by heating at about 1000° C. Hydrogen plasma treatment is then performed. As a result, defects in the semiconductor layer 30S are terminated with hydrogen, and characteristics of the switching element are improved.

Figure 26:
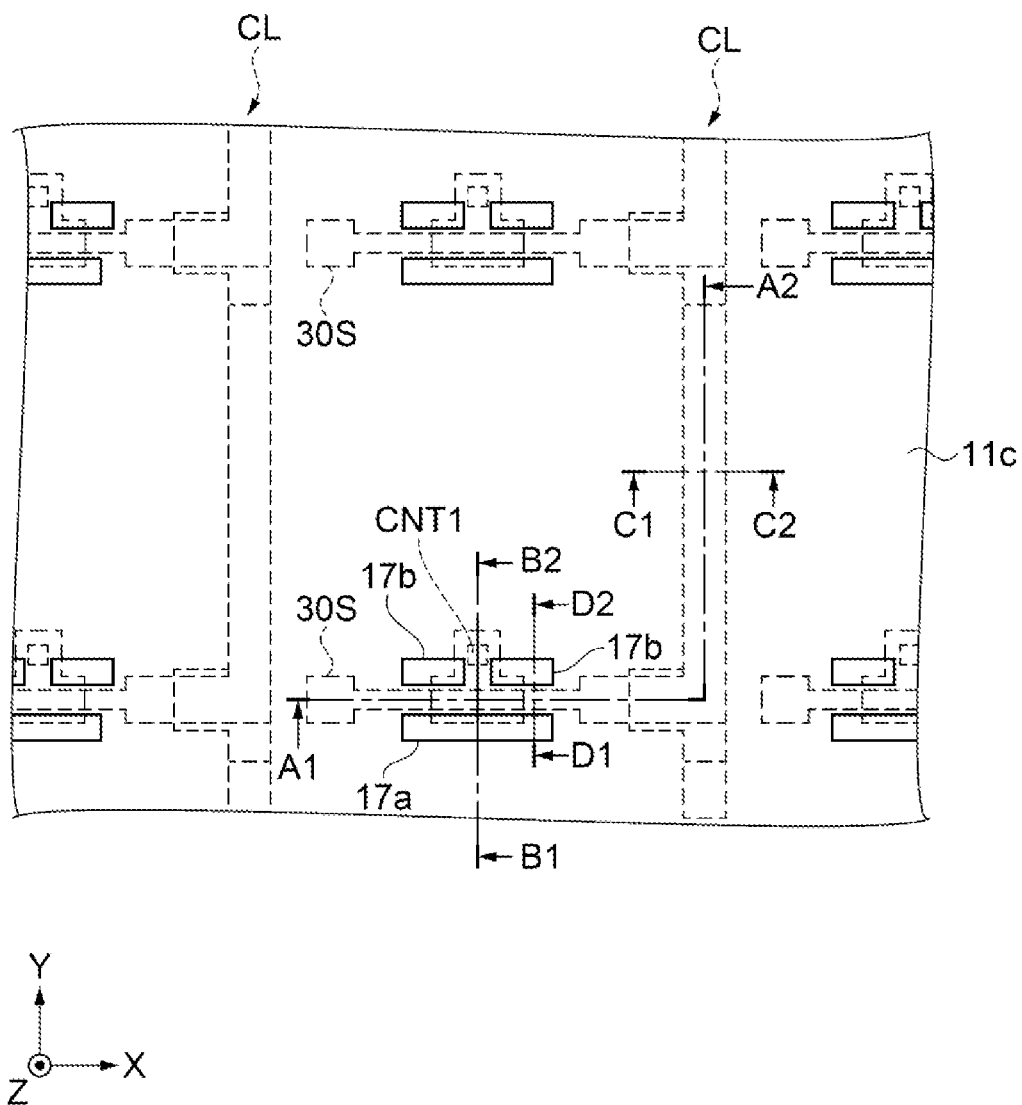
FIG. 26 is a schematic plan view illustrating the method for manufacturing the element substrate.

In step S11, as illustrated in FIG. 25 and FIG. 26, the slits 17a and 17b are formed by dry etching. The slits 17a and 17b are grooves for providing the light shielding walls 7a and 7b. As described above, the slits 17a and 17b penetrate the first interlayer insulating layer 11a, the gate insulating layer 11b, and the second interlayer insulating layer 11c to reach the substrate 10s, and are also formed in the substrate 10s. The slits 17a and 17b are disposed so as to face each other in the ±Y direction (that is, the second directions) with at least the LDD regions s2 and s4 of the semiconductor layer 30S interposed therebetween. Note that, although the first slit 17a is formed in the B1-B2 cross section, since the gate electrode 30G is disposed, only a part of the second slit 17b is formed.

Figure 27:
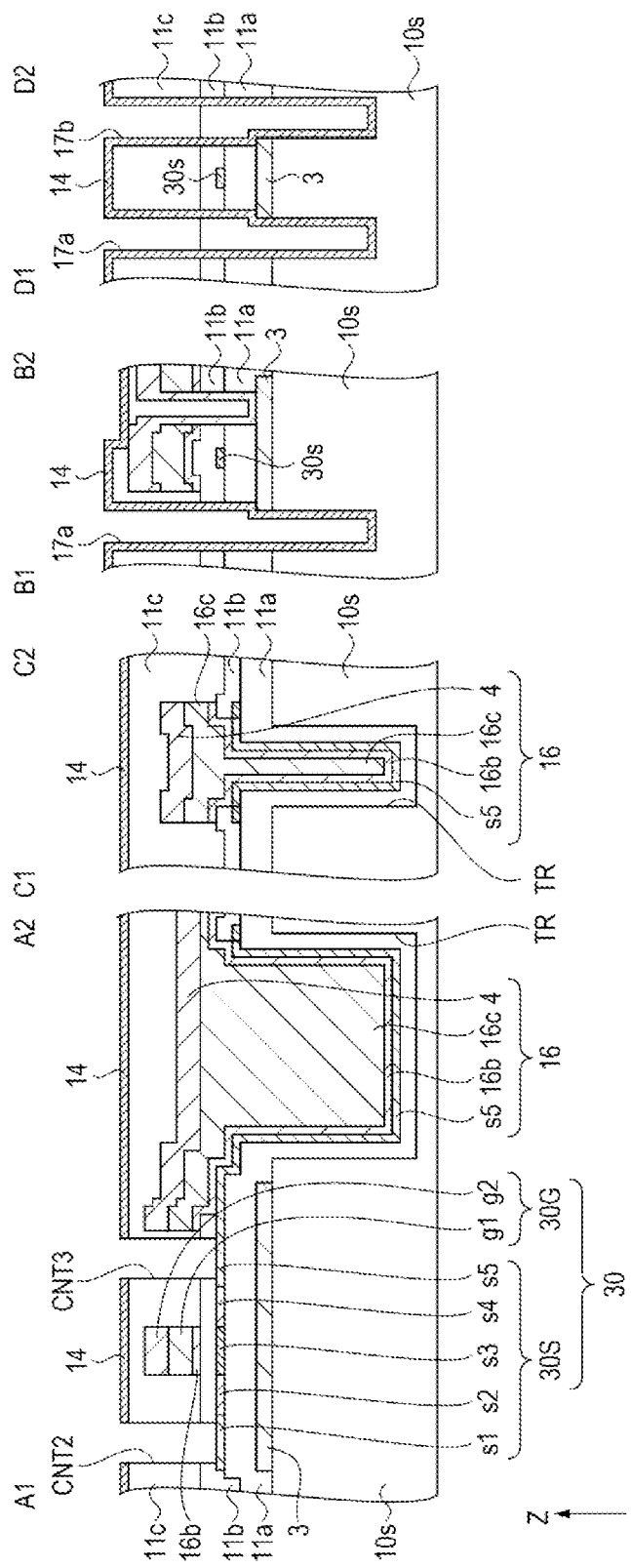
FIG. 27 is a schematic cross-sectional view illustrating the method for manufacturing the element substrate.

In step S12, the light shielding walls 7a, 7b, the data line 6, and the like are formed as illustrated in FIG. 27 to FIG. 30. First, as illustrated in FIG. 27, a CVD method or an ALD (Atomic Layer Deposition) method is used to form a cover layer 14 formed of a silicon oxide film or the like above the second interlayer insulating layer 11c including the slits 17a and 17b. The cover layer 14 is a film for ensuring insulation properties between the light shielding walls 7a and 7b that are subsequently formed and the scanning line 3. A thickness of the cover layer 14 is from 50 nm to 200 nm, for example.

Figure 28:
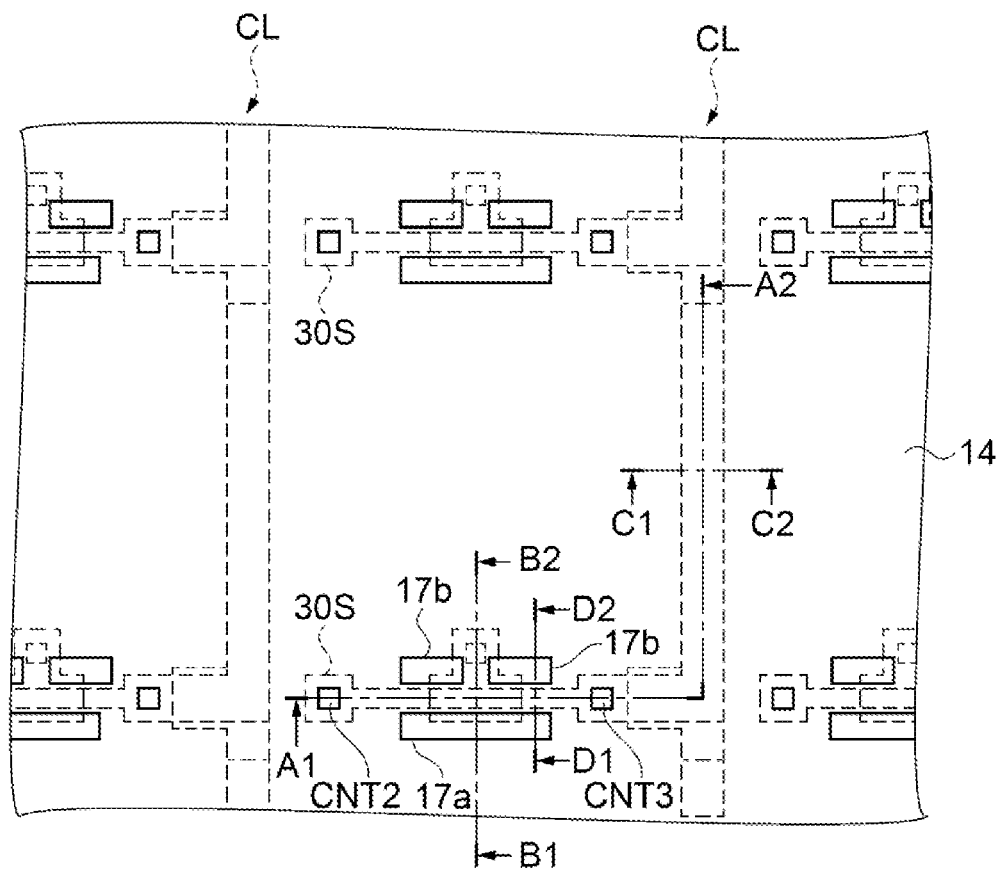
FIG. 28 is a schematic plan view illustrating the method for manufacturing the element substrate.

Next, as illustrated in FIG. 27 and FIG. 28, the contact holes CNT2 and CNT3 are formed by dry etching. The contact holes CNT2 and CNT3 penetrate the cover layer 14, the second interlayer insulating layer 11c and the gate insulating layer 11b, and reach up to the semiconductor layer 30S. In plan view, the contact hole CNT2 overlaps the one source drain region s1, and the contact hole CNT3 overlaps a part of the other source drain region s5 that is adjacent to the LDD region s4. Then, the processing proceeds to step S12.

Figure 29:
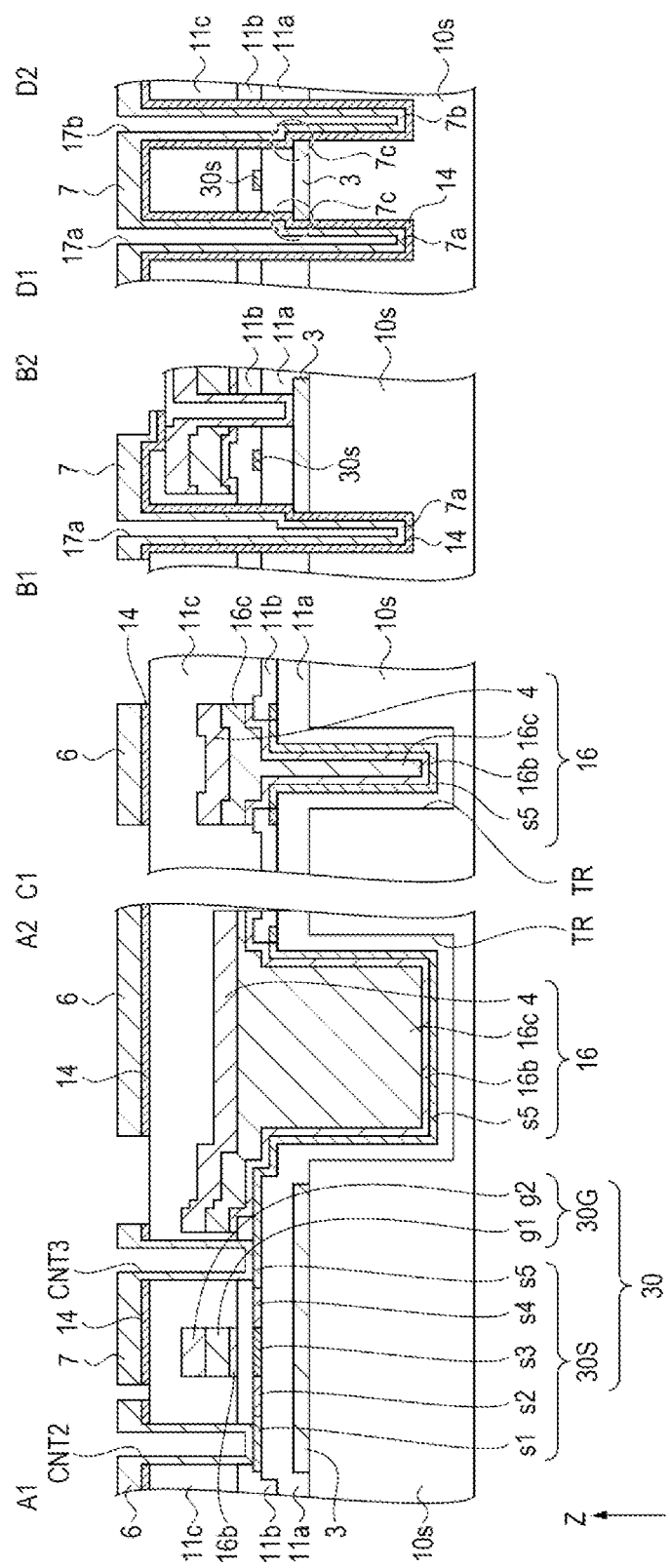
FIG. 29 is a schematic cross-sectional view illustrating the method for manufacturing the element substrate.

Next, the light shielding walls 7a, 7b, the data lines 6, and the second relay layer 7 are provided. At this time, as illustrated in FIG. 29, the data line 6 and the second relay layer 7 are provided so as to fill the contact holes CNT2 and CNT3, respectively. Furthermore, the light shielding walls 7a and 7b are provided by forming the same film as the data line 6 and the second relay layer 7 at the side surfaces and the bottom surfaces of the slits 17a and 17b.

In this way, the light shielding walls 7a and 7b are disposed facing each other in the ±Y directions (that is, the second directions) with the LDD regions s2 and s4 interposed therebetween, thus light incident on the liquid crystal device 100 can be prevented from entering the LDD regions s2 and s4.

Also, as illustrated in FIG. 29, the slit 17a or 17b (that is, the light shielding wall 7a or 7b) is disposed overlapping a part of the scanning line 3 in the second direction (an overlapping part 7c). In this way, because the light shielding walls 7a and 7b are disposed overlapping a part of the scanning line 3, the light shielding walls 7a and 7b can be made closer to the scanning line 3 side compared to a case where the light shielding walls 7a and 7b are disposed without overlapping the scanning line 3. Thus, by providing the light shielding walls 7a and 7b, it is possible to suppress an extreme decrease in an opening ratio.

In addition, the light shielding walls 7a and 7b have drain potential, which is the same potential as that of the second relay layer 7. Since the light shielding walls 7a and 7b, which have the drain potential, sandwich the TFT 30, effects on characteristics of the TFT 30 can be reduced.

As illustrated in FIG. 30, the data line 6 is provided extending in the ±Y directions, and overlaps a part (not illustrated) extending in the ±Y directions of the other source drain region s5. In other words, the data line 6 is provided extending in the ±Y directions so as to overlap the trench TR, and the capacitance element 16 in plan view. The data line 6 has a part protruding in the +X direction that overlaps the closed region CL extending in the ±X directions. The contact hole CNT2 is provided in the part.

The second relay layer 7 is provided in an island shape independent of the data line 6. The second relay layer 7 has a main body portion 7*d* that extends in the ±X directions and overlaps a part of the semiconductor layer 30S below, and a protruding portion 7*e* that protrudes in the ±Y directions from the main body portion 7*d*.

The data line 6 and the one source drain region s1 of the semiconductor layer 30S are electrically coupled via the contact hole CNT2. The second relay layer 7 and the other source drain region s5 of the semiconductor layer 30S are electrically coupled via the contact hole CNT3. Then the processing proceeds to step S13.

In step S13, an upper layer of the data line 6 is formed. First, the third interlayer insulating layer 12 is provided in a solid form, at the data line 6, the second relay layer 7, the light shielding walls 7*a*, 7*b*, and the second interlayer insulating layer 11*c*. The third interlayer insulating layer 12 is provided, for example, by a plasma CVD method using a silicon oxide film.

Figure 31:
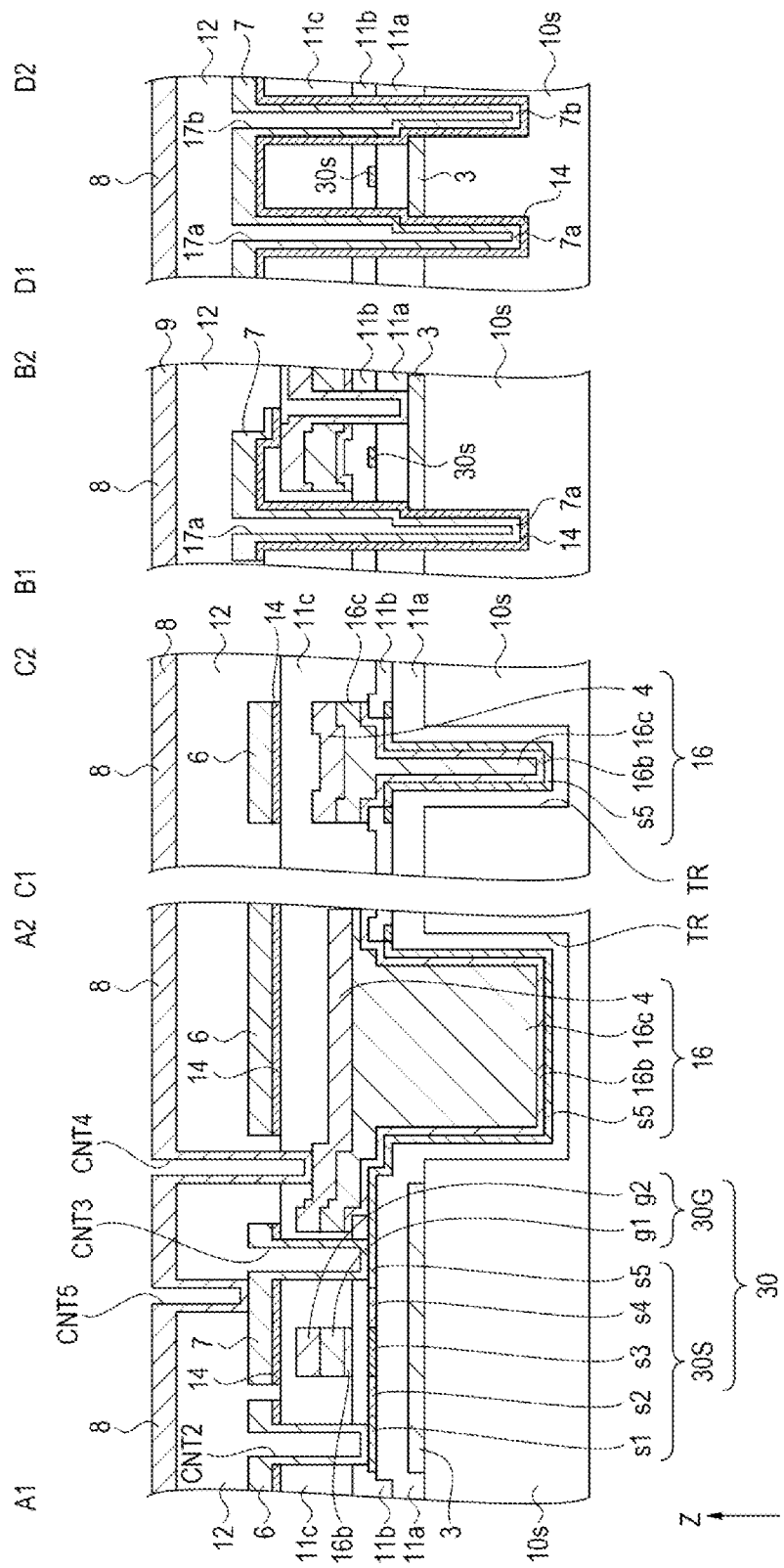
FIG. 31 is a schematic cross-sectional view illustrating the method for manufacturing the element substrate.
Figure 32:
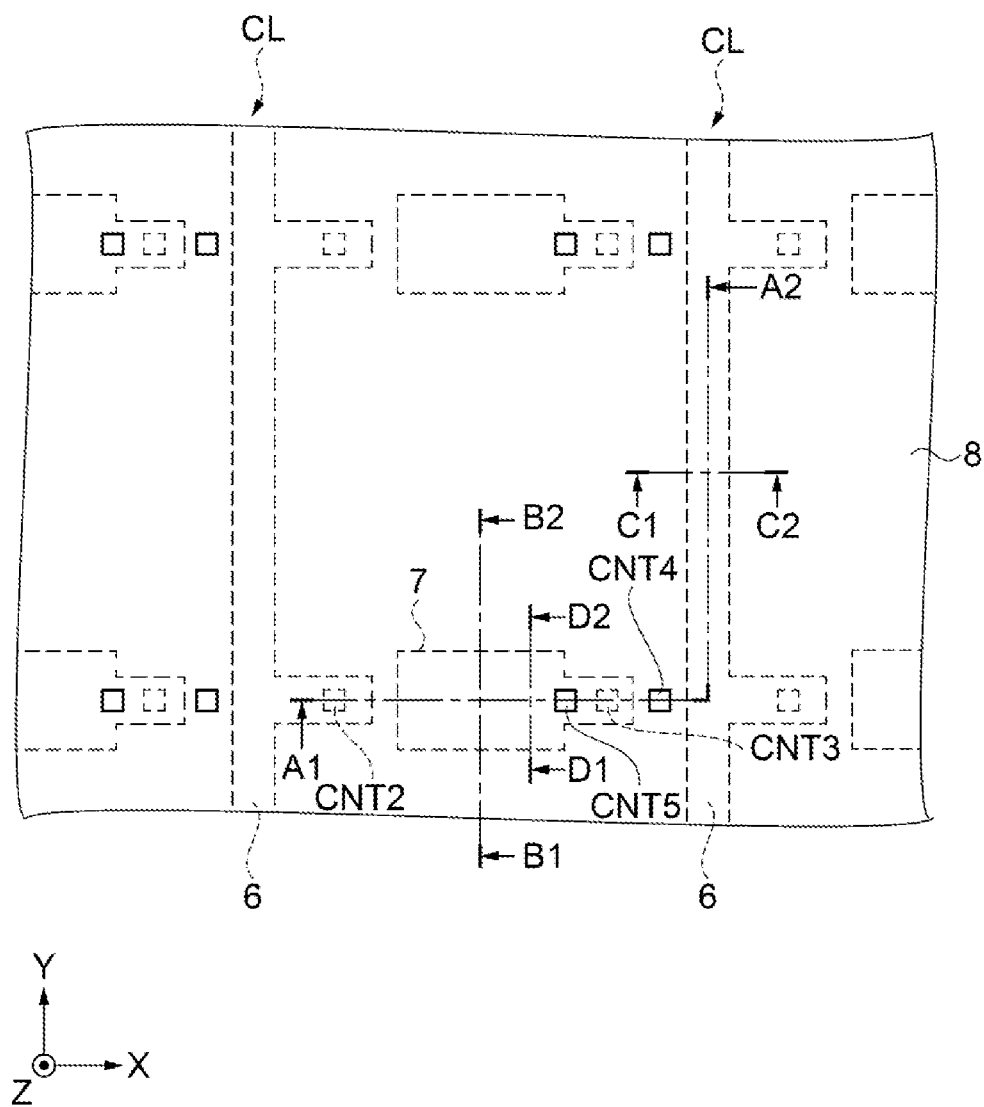
FIG. 32 is a schematic plan view illustrating the method for manufacturing the element substrate.

Next, as illustrated in FIG. 31 and FIG. 32, the contact holes CNT4 and CNT5 are provided by dry etching. The contact hole CNT4 penetrates the third interlayer insulating layer 12 and the second interlayer insulating layer 11*c*, and reaches the second upper capacitance electrode 4 of the capacitance element 16. The contact hole CNT5 penetrates the third interlayer insulating layer 12 and reaches the second relay layer 7.

Figure 33:
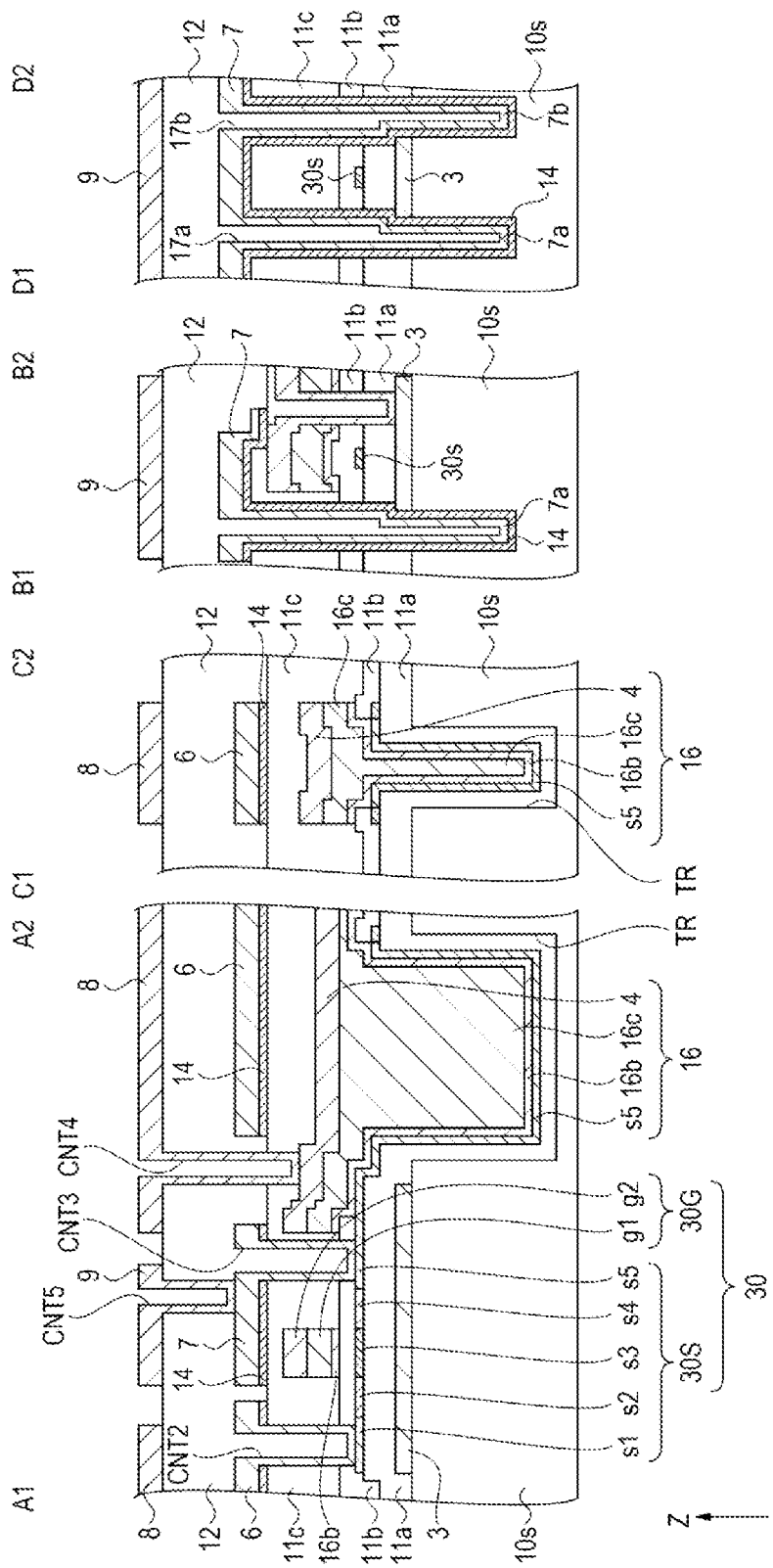
FIG. 33 is a schematic cross-sectional view illustrating the method for manufacturing the element substrate.

Next, as illustrated in FIG. 33, the capacitance line 8 and the first relay layer 9 are formed. At this time, the capacitance line 8 and the first relay layer 9 are provided so as to fill the contact holes CNT4 and CNT5, respectively.

The capacitance line 8 is electrically coupled to the second upper capacitance electrode 4 via the contact hole CNT4. The first relay layer 9 is electrically coupled to the other source drain region s5 of the semiconductor layer 30S, via the contact hole CNT5, the second relay layer 7, and the contact hole CNT3.

As illustrated in FIG. 34, the capacitance line 8 is provided extending in the ±Y directions so as to overlap the closed region CL extending in the ±Y directions. The capacitance line 8 has a main body portion 8*a* that overlaps the data line 6 provided below, and extends in the ±Y directions, a protruding portion 8*b* protruding in the −X direction from the main body portion 8*a*, and another protruding portion 8*c* protruding from the main body 8*a* in the +X direction opposite the protruding portion 8*b*. The protruding portion 8*b* overlaps a part of the semiconductor layer 30S extending in the ±X directions. The contact hole CNT4 is provided in the protruding portion 8*b*. The other protruding portion 8*c* overlaps another semiconductor layer 30S (not illustrated) that is next to the semiconductor layer 30S in the +X direction.

The first relay layer 9 is provided in an island shape independent of the capacitance line 8, and overlaps the contact hole CNT5. The first relay layer 9 has a main body portion 9*a* that extends in the ±X directions, and overlaps a part of the semiconductor layer 30S below, and a protruding portion 9*b* that protrudes in the ±Y directions from the main body portion 9*a*.

Figure 35:
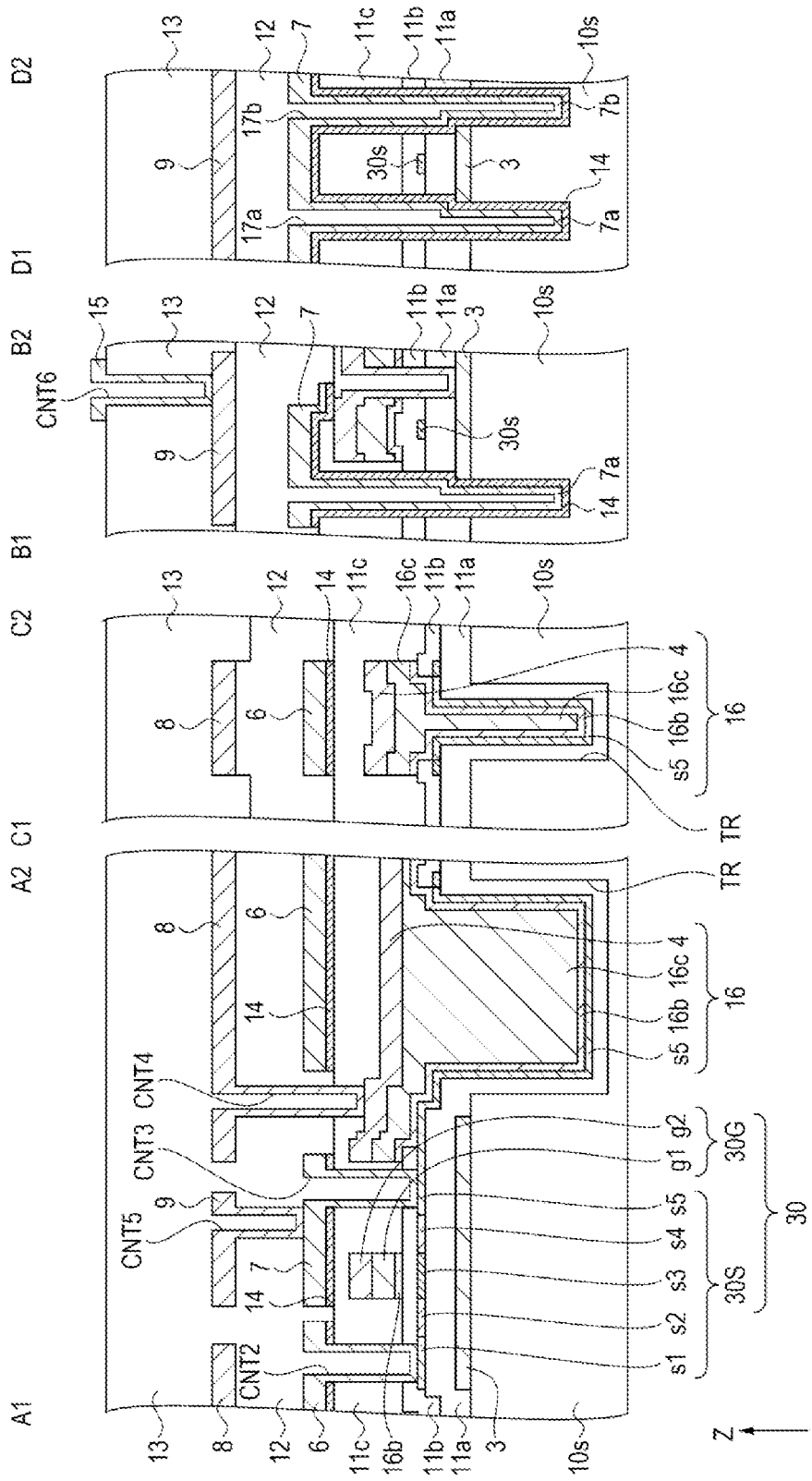
FIG. 35 is a schematic cross-sectional view illustrating the method for manufacturing the element substrate.
Figure 36:
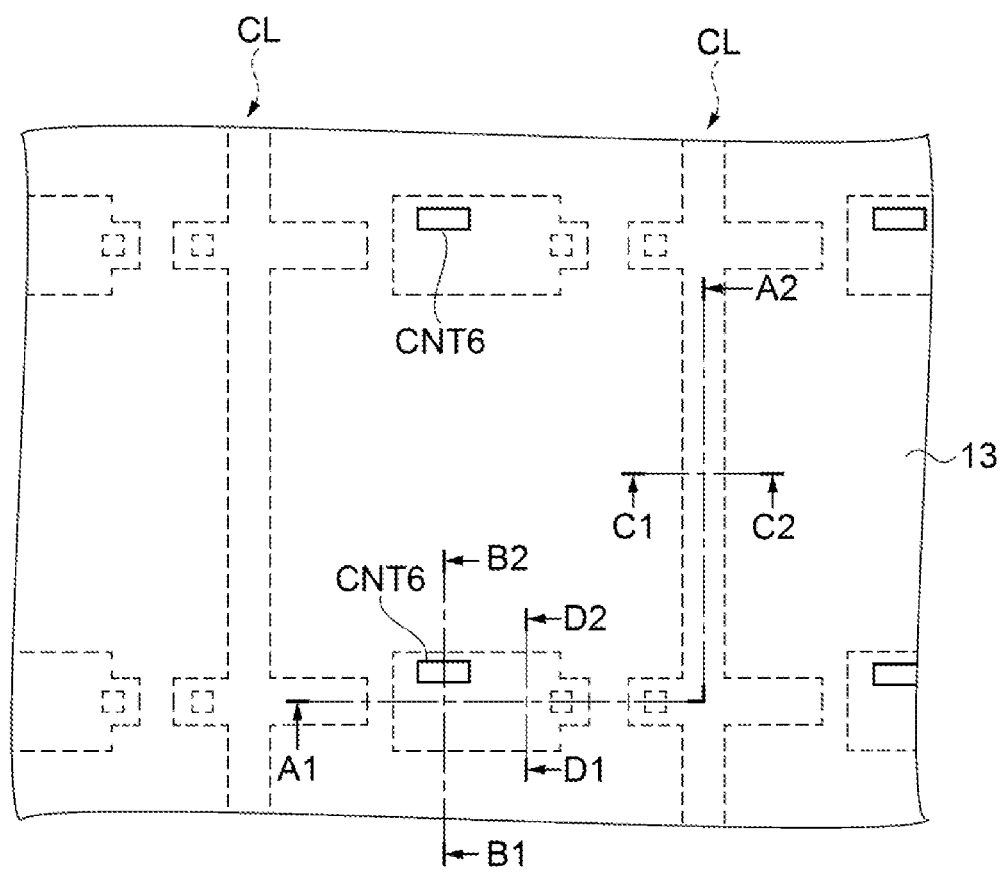
FIG. 36 is a schematic plan view illustrating the method for manufacturing the element substrate.

Next, as illustrated in FIG. 35 and FIG. 36, the fourth interlayer insulating layer 13 is provided in a solid form at the capacitance line 8, the first relay layer 9, and the third interlayer insulating layer 12 exposed upward. The fourth interlayer insulating layer 13 is provided, for example, by a plasma CVD method using a silicon oxide film. After the fourth interlayer insulating layer 13 is provided, a planarization process such as a CMP (Chemical & Mechanical Polishing) process is performed to mitigate unevenness caused by underlying structure.

Figure 37:
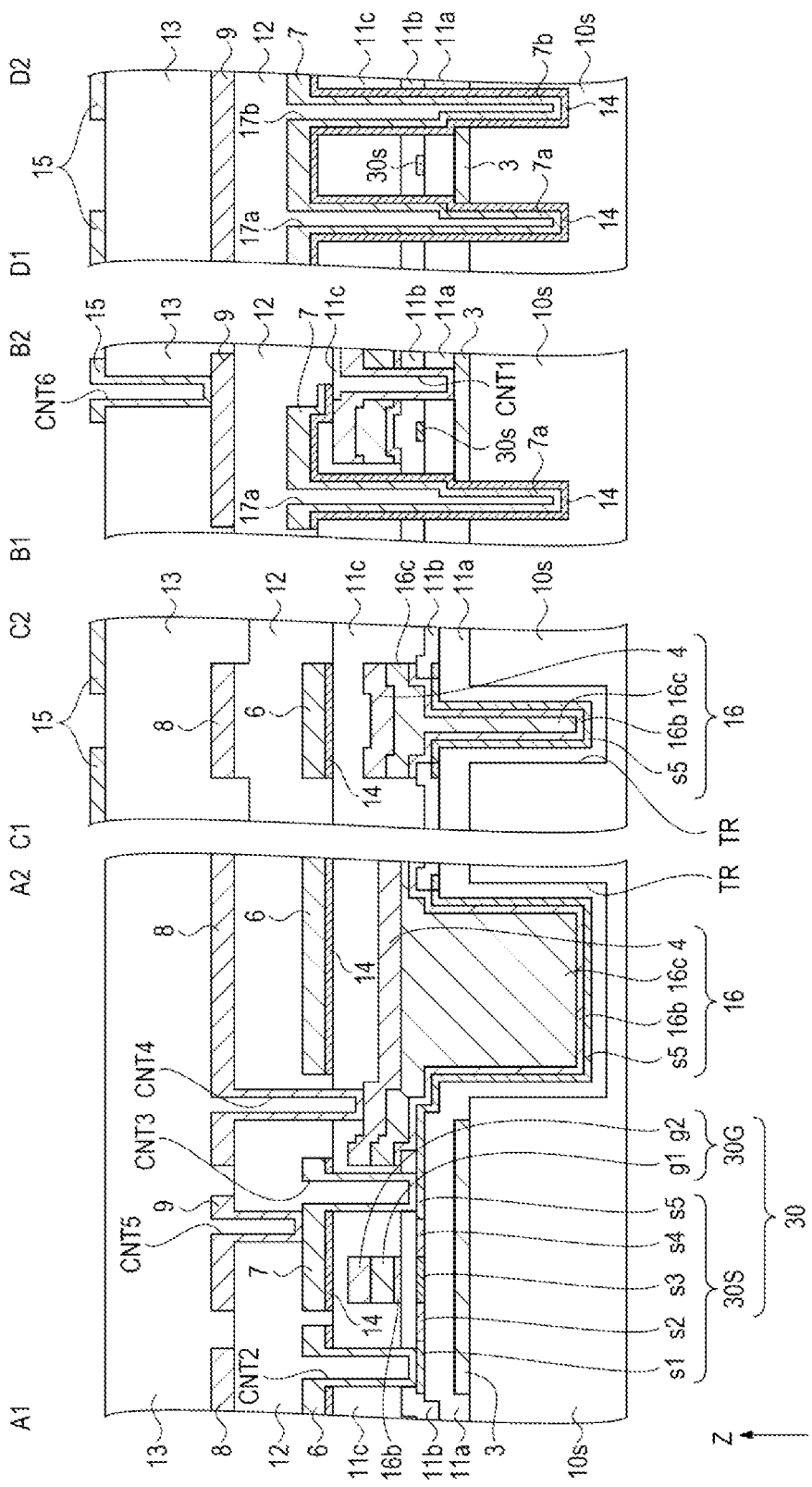
FIG. 37 is a schematic cross-sectional view illustrating the method for manufacturing the element substrate.
Figure 38:
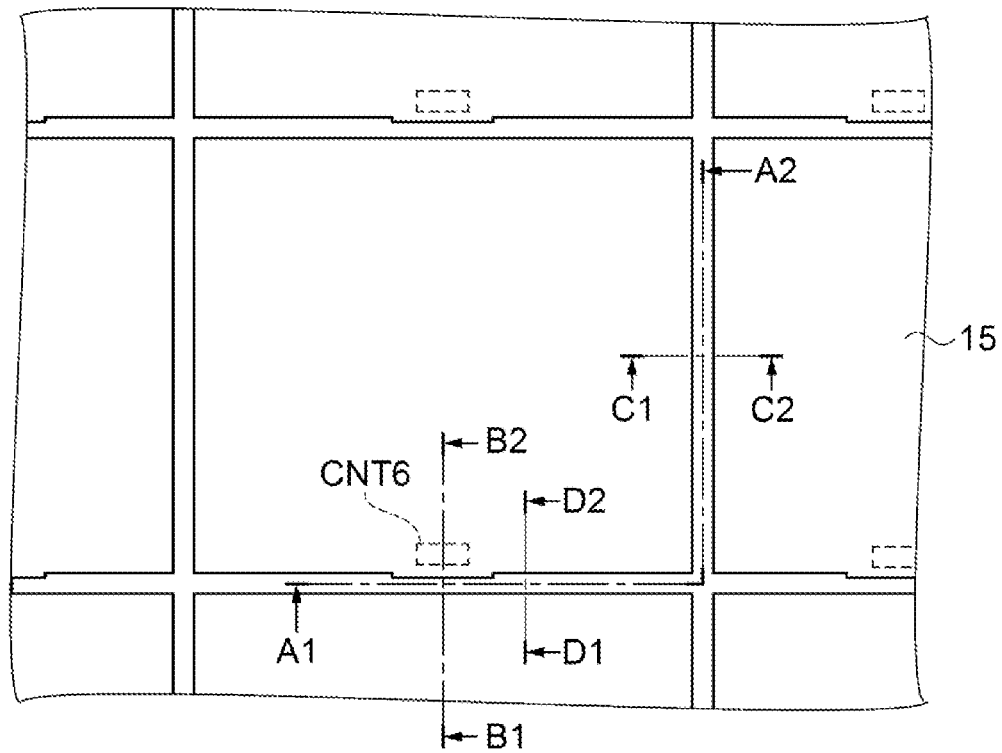
FIG. 38 is a schematic plan view illustrating the method for manufacturing the element substrate.
Figure 38:
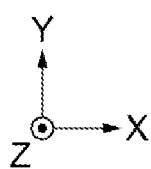

Next, the contact hole CNT6 is provided that penetrates the fourth interlayer insulating layer 13 to expose the first relay layer 9, by dry etching. Thereafter, as illustrated in FIG. 37 and FIG. 38, the pixel electrode 15 corresponding to the opening region OP (see FIG. 4) is provided at the fourth interlayer insulating layer 13. At this time, the pixel electrode 15 is provided so as to fill the contact hole CNT6. As a result, the pixel electrode 15 is electrically coupled to the other source drain region s5 of the semiconductor layer 30S, via the contact hole CNT6, the first relay layer 9, the contact hole CNT5, the second relay layer 7, and the contact hole CNT3.

Of the method for manufacturing the element substrate 10, known techniques can be employed for subsequent steps, and descriptions thereof will be omitted. According to the method for manufacturing described above, the element substrate 10 and the liquid crystal device 100 are manufactured.

Next, a configuration of a projection-type display device 1000 as an electronic apparatus will be described with reference to FIG. 39.

Figure 39:
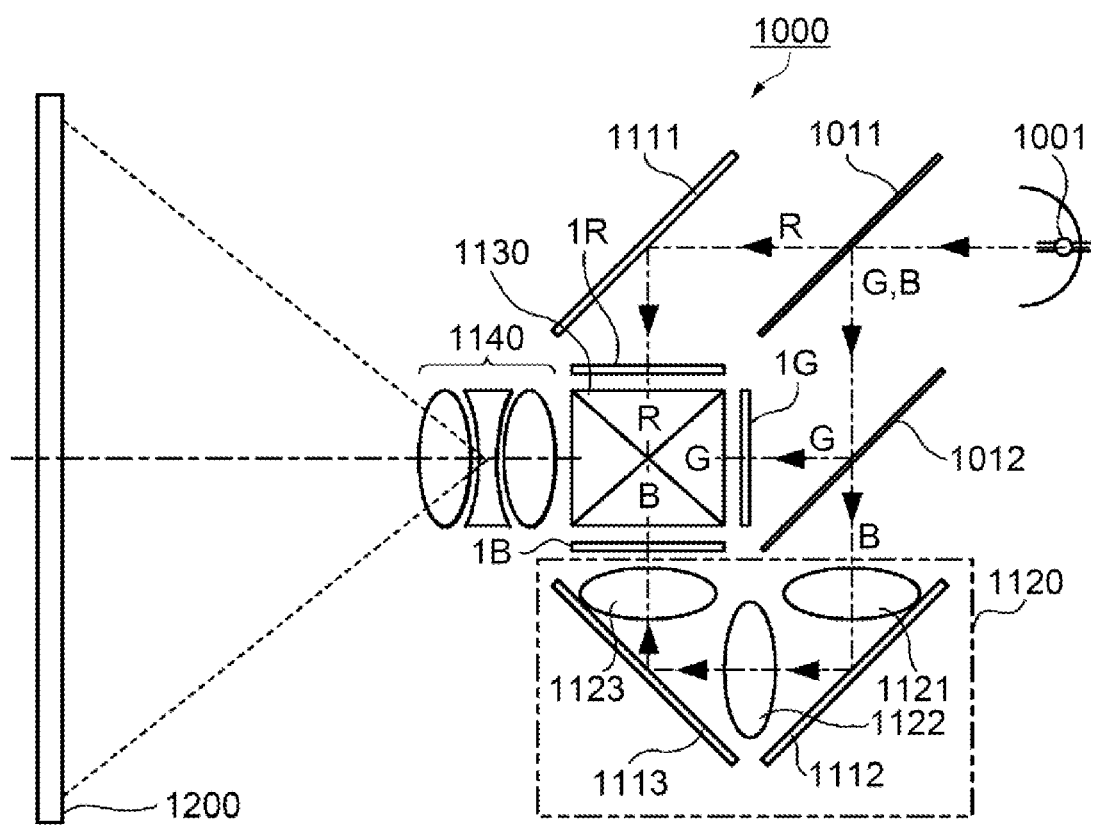
FIG. 39 is a schematic view illustrating a configuration of a projection-type display device as an electronic apparatus.

As illustrated in FIG. 39, the projection-type display device 1000 as an electronic apparatus includes a lamp unit 1001 as a light source, dichroic mirrors 1011, 1012 as a color separation optical system, three liquid crystal devices 1B, 1G, 1R as electro-optical panels, three reflection mirrors 1111, 1112, 1113, three relay lenses 1121, 1122, 1123, a dichroic prism 1130 as a color synthesis optical system, and a projection lens 1140 as a projection optical system.

In the lamp unit 1001, for example, a discharge type light source is employed. The method of the light source is not limited thereto, and a solid light source such as a light emitting diode, a laser, or the like may be employed.

Light emitted from the lamp unit 1001 is separated by the two dichroic mirrors 1011 and 1012 into three colors of colored light with wavelength ranges different from each other. The three colors of colored light include substantially red light, substantially green light, and substantially blue light. In the following description, the substantially red light is also referred to as red light R, the substantially green light is also referred to as green light G, and the substantially blue light is also referred to as blue light B.

The dichroic mirror 1011 transmits the red light R, and reflects the green light G and the blue light B each having a wavelength shorter than that of the red light R. The red light R transmitted through the dichroic mirror 1011 is reflected by the reflection mirror 1111, and is incident on the liquid crystal device 1R. The green light G reflected by the dichroic mirror 1011 is reflected by the dichroic mirror 1012, and is then incident on the liquid crystal device 1G. The blue light B reflected by the dichroic mirror 1011 is transmitted through the dichroic mirror 1012, and is emitted to a relay lens system 1120.

The relay lens system 1120 has relay lenses 1121, 1122, 1123, and reflection mirrors 1112, and 1113. Since a light path of the blue light B is longer compared to the green light G and the red light R, luminous flux tends to increase. Therefore, expansion of the luminous flux is suppressed using the relay lens 1122. The blue light B incident on the relay lens system 1120 is reflected by the reflection mirror 1112 and is converged in a vicinity of the relay lens 1122 by the relay lens 1121. Then, the blue light B is incident on the liquid crystal device 1B, via the reflection mirror 1113 and the relay lens 1123.

The liquid crystal device 100 as an electro-optical device according to the above-described exemplary embodiment is applied to the liquid crystal devices 1R, 1G, and 1B, which are light modulating devices, in the projection-type display device 1000. Additionally, as the liquid crystal devices 1R, 1G, and 1B, a liquid crystal device according to other than the present exemplary embodiment may be applied.

Each of the liquid crystal devices 1R, 1G, and 1B is electrically coupled to an upper circuit of the projection-type display device 1000. As a result, image signals specifying gray scale levels of the red light R, the green light G, and the blue light B are supplied from external circuits, respectively, and are processed by the upper circuit. As a result, the liquid crystal devices 1R, 1G, and 1B are driven, and each colored light is modulated.

The red light R, the green light G, and the blue light B modulated by the respective liquid crystal devices 1R, 1G, and 1B are incident on the dichroic prism 1130 from three directions. The dichroic prism 1130 synthesizes the incident red light R, green light G, and blue light B. In the dichroic prism 1130, the red light R and the blue light B are reflected at 90 degrees, and the green light G is transmitted. Therefore, the red light R, the green light G, and the blue light B are synthesized as display light for displaying a color image, and the display light is emitted toward the projection lens 1140.

The projection lens 1140 is disposed facing an outside of the projection-type display device 1000. The display light is expanded and emitted via the projection lens 1140, and projected onto a screen 1200, which is a projection target.

In the present exemplary embodiment, the projection-type display device 1000 is illustrated as an electronic apparatus, but the electronic apparatus to which the electro-optical device according to the present disclosure is applied is not limited thereto. For example, the electro-optical device according to the present disclosure may be applied to an electronic apparatus such as a projection type HUD (Head-Up Display), a direct view HMD (Head Mounted Display), a personal computer, a digital camera, a liquid crystal television, or the like.

As described above, the liquid crystal device 100 of the present exemplary embodiment includes the substrate 10s, the scanning line 3 extending in the first direction, the data line 6 extending in the second direction intersecting the first direction, the TFT 30 having the semiconductor layer 30S in which the one source drain region s1, the one LDD region s2, the channel region s3, the other LDD region s4, and the first portion s5a (see FIG. 16) of the other source drain region s5 extend along the first direction at a position overlapping the scanning line 3, and the second portion s5b (see FIG. 16) of the other source drain region extends along the second direction at a position overlapping the data line 6, and the capacitance element 16 configured to include at least the second portion s5b at a position overlapping the data line 6, wherein the light shielding walls 7a and 7b are disposed on both sides of the one LDD region s2 and the other LDD region s4 extending along the first direction, the substrate 10s has the recessed portions 17a and 17b in a region overlapping the light shielding walls 7a and 7b, and a part of the light shielding walls 7a and 7b is disposed along the side surfaces and the bottom surfaces of the recessed portions 17a and 17b.

According to this configuration, since the light shielding walls 7a and 7b are disposed on both the sides in the second direction with the TFT 30 interposed therebetween, light from the second direction that is easily incident on the TFT 30 can be easily shielded, and display quality can be improved. In addition, an opening ratio can be increased, and a retention capacitor can be ensured. In addition, since the light shielding walls 7a and 7b are disposed on both the sides in the second direction, with the LDD regions s2 and s4 that easily affect the characteristics of the TFT 30 interposed therebetween, it is possible to prevent light from entering the LDD regions s2 and s4. Additionally, since the light shielding walls 7a and 7b are further provided at the side surfaces and the bottom surfaces of the slits 17a and 17b provided at the substrate 10s, light reflected on the side of the substrate 10s can be shielded by respective end portions 17d (see FIG. 5) of the light shielding walls 7a and 7b, which makes it possible to suppress incident on the TFT 30. In other words, light of rear surface reflection can be shielded. Additionally, since the light shielding walls 7a and 7b are further disposed from the one LDD region s2 to the other LDD region s4, light can be prevented from entering the LDD regions s2 and s4, which easily affect the characteristics of the TFT 30.

In addition, in the liquid crystal device 100, the TFT 30 may have the gate electrode 30G, and an end portion 17c (see FIG. 5) in the light shielding walls 7a and 7b on a side away from the substrate 10s may be disposed in an upper layer of the gate electrode 30G. According to this configuration, since the light shielding walls 7a and 7b are disposed up to the upper layer of the gate electrode 30G, light incident from above the TFT 30 can be shielded by the light shielding walls 7a and 7b.

In addition, in the liquid crystal device 100, the light shielding walls 7a and 7b may be disposed overlapping a part of the scanning line 3 in the second direction. According to this configuration, the light shielding walls 7a and 7b are disposed overlapping a part of the scanning line 3, making it possible to make the light shielding walls 7a and 7b closer to the scanning line 3 side, compared to a case where the light shielding walls 7a and 7b are disposed without overlapping the scanning line 3. Thus, by providing the light shielding walls 7a and 7b, it is possible to suppress an extreme decrease in an opening ratio.

In addition, in the liquid crystal device 100, the light shielding walls 7a and 7b may have drain potential. According to this configuration, the light shielding walls 7a and 7b having the drain potential sandwich the TFT 30, and therefore, effects on the characteristics of the TFT 30 be reduced.

In addition, in the liquid crystal device 100, the light shielding walls 7a and 7b may be formed of a material containing aluminum. According to this configuration, the light shielding walls 7a and 7b are made of a material containing aluminum, thus it is possible to make it difficult for light to pass through, which makes it possible to improve light-shielding properties.

Furthermore, the electronic apparatus of the present exemplary embodiment includes the liquid crystal device 100 described above, and thus, an electronic apparatus capable of improving display quality can be provided.

A modified example of the above-described exemplary embodiment will be described below.

The light shielding walls 7a and 7b of the liquid crystal device 100 described above are provided from the one LDD region s2 to the other LDD region s4, however, the present disclosure is not limited thereto, and for example, the light shielding walls 7a and 7b may be provided on both sides in the second direction so as to sandwich only the other LDD region s4. With this, the light shielding walls are provided so as to sandwich the LDD region s4 on the drain potential side that is susceptible to affecting the characteristics of the TFT 30, thus it is possible to effectively shield light with a small amount of material.

In addition, the description has been given using the liquid crystal device 100 as an electro-optical device as an example, but the present disclosure is not limited thereto, and the present disclosure may be applied to, for example, an organic EL device, a plasma display, an electronic paper (EPD), or the like.

What is claimed is:

1. An electro-optical device, comprising:
   a substrate having a recessed portion;
   a scanning line extending along a first direction;
   a data line extending along a second direction intersecting the first direction;
   a transistor having a semiconductor layer in which one source drain region, one LDD region, a channel region, another LDD region, and a first portion of another source drain region extend along the first direction, at a position overlapping the scanning line, and a second portion of the other source drain region extends along the second direction, at a position overlapping the data line; and
   a light shielding wall that is disposed along the one LDD region or the other LDD region and has a part disposed in the recessed portion of the substrate.

2. The electro-optical device according to claim 1, wherein
   the transistor has a gate electrode, and
   an end portion of the light shielding wall on a side opposite to the substrate side is disposed at a position farther from the substrate than an end portion of the gate electrode on a side opposite to the substrate side.

3. The electro-optical device according to claim 1, comprising:
   another light shielding wall provided so as to sandwich the semiconductor layer with the light shielding wall, and disposed along the one LDD region, the channel region, and the other light shielding wall.

4. The electro-optical device according to claim 1, wherein
   the light shielding wall is disposed overlapping a part of the scanning line.

5. The electro-optical device according to claim 1, wherein
   the light shielding wall is electrically coupled to the other source drain region.

6. The electro-optical device according to claim 1, wherein
   the light shielding wall is formed of a material containing aluminum.

7. An electronic apparatus, comprising:
   the electro-optical device according to claim 1.

* * * * *